US008877096B2

(12) United States Patent
Pan et al.

(10) Patent No.: US 8,877,096 B2
(45) Date of Patent: Nov. 4, 2014

(54) NEAR INFRARED DOPED PHOSPHORS HAVING A ZINC, GERMANIUM, GALLATE MATRIX

(75) Inventors: Zhengwei Pan, Bogart, GA (US); Yi-Ying Lu, Athens, GA (US)

(73) Assignee: University of Georgia Research Foundation, Inc., Athens, GA (US)

( * ) Notice: Subject to any disclaimer, the term of this patent is extended or adjusted under 35 U.S.C. 154(b) by 181 days.

(21) Appl. No.: 13/394,627

(22) PCT Filed: Sep. 21, 2010

(86) PCT No.: PCT/US2010/049625
§ 371 (c)(1),
(2), (4) Date: Apr. 18, 2012

(87) PCT Pub. No.: WO2011/035292
PCT Pub. Date: Mar. 24, 2011

(65) Prior Publication Data
US 2012/0193578 A1    Aug. 2, 2012

Related U.S. Application Data

(60) Provisional application No. 61/244,247, filed on Sep. 21, 2009.

(51) Int. Cl.
*C09K 11/66* (2006.01)
*C09K 11/08* (2006.01)
(Continued)

(52) U.S. Cl.
CPC .............. *C09K 11/662* (2013.01); *C09K 11/685* (2013.01); *C04B 35/01* (2013.01); *C04B 35/16*
(Continued)

(58) Field of Classification Search
CPC .......... C09K 11/68; C09K 11/685; C09D 5/22
USPC ......................... 252/301.4 F, 301.36, 301.6 F
See application file for complete search history.

(56) References Cited

U.S. PATENT DOCUMENTS 3,294,699 A     12/1966  Lange
6,093,346 A      7/2000  Xiao et al.
(Continued)

FOREIGN PATENT DOCUMENTS

JP    11-152470 A    6/1999
WO   97/02721 A1    1/1997
(Continued)

OTHER PUBLICATIONS

Abritta et al. "The Optical Properties of $Cr^{3+}$ in $LiAl_5O_8$ and $LiGa_4O_8$" 1979, *Journal of Luminescence* 18/19:179-182.
(Continued)

*Primary Examiner* — Carol M Koslow
(74) *Attorney, Agent, or Firm* — Mueting Raasch & Gebhardt, P.A.

(57) ABSTRACT

Phosphors based on transition metal-activated gallates, particularly $Cr^{3+}$- and $Ni^{2+}$-activated zinc germanium gallates, are disclosed herein. In some embodiments such phosphors can exhibit persistent infrared phosphorescence for as long as 400 hours. Such phosphors can be used, for example, as components of a luminescent paint.

20 Claims, 32 Drawing Sheets

(51) Int. Cl.
H01L 33/00 (2010.01)
C09K 11/68 (2006.01)
C04B 35/01 (2006.01)
C04B 35/16 (2006.01)
C04B 35/457 (2006.01)
C09D 5/22 (2006.01)
C09K 11/62 (2006.01)
H01L 33/50 (2010.01)

(52) U.S. Cl.
CPC ...... (2013.01); *C04B 35/457* (2013.01); *C09D 5/22* (2013.01); *C09K 11/623* (2013.01); *C09K 11/682* (2013.01); *H01L 33/502* (2013.01); C04B 2235/3203 (2013.01); C04B 2235/3206 (2013.01); C04B 2235/3208 (2013.01); C04B 2235/3213 (2013.01); C04B 2235/3215 (2013.01); C04B 2235/3224 (2013.01); C04B 2235/3227 (2013.01); C04B 2235/3229 (2013.01); C04B 2235/3241 (2013.01); C04B 2235/3279 (2013.01); C04B 2235/3284 (2013.01); C04B 2235/3286 (2013.01); C04B 2235/3287 (2013.01); C04B 2235/3298 (2013.01)
USPC ............... 252/301.6 F; 252/301.36

(56) References Cited

U.S. PATENT DOCUMENTS

| | | | |
|---|---|---|---|
| 6,117,362 A | 9/2000 | Yen et al. | |
| 6,267,911 B1 | 7/2001 | Yen et al. | |
| 6,632,758 B2 | 10/2003 | Beall et al. | |
| 6,953,536 B2 | 10/2005 | Yen et al. | |
| 7,303,697 B2 * | 12/2007 | Isobe | 252/301.6 F |
| 7,399,998 | 7/2008 | Roth et al. | |
| 7,554,129 B2 | 6/2009 | Roth et al. | |
| 2007/0158615 A1 | 7/2007 | Ohashi et al. | |
| 2012/0261617 A1 | 10/2012 | Pan et al. | |
| 2013/0099163 A9 | 4/2013 | Pan et al. | |

FOREIGN PATENT DOCUMENTS

| | | | |
|---|---|---|---|
| WO | 2011/035292 | A2 | 3/2011 |
| WO | 2011/035294 | A2 | 3/2011 |
| WO | 2011/035294 | A3 | 7/2011 |
| WO | 2011/035292 | A3 | 10/2011 |

OTHER PUBLICATIONS

Blasse et al., "Observations on the luminescence of some oxides containing post-transition metal ions," *Materials Research Bulletin*, Apr. 1, 1970; 5(4):231-241.
de Chermont et al., "Nanoprobes with near-infrared persistent luminescence for in vivo imaging," 2007, *PNAS* 104(22):9266-9271.
Donegan et al., "The optical spectroscopy of Ni-doped garnets," *J. Lumin.*, 1986; 35:57.
Dubrovina et al., "The optical spectroscopy of Ni-doped garnets," *Chem. Phys. Lett.*, 1990; 170(5,6):473-477.
Glynn et al. "Structure of the Fluorescence Levels of $LiGa_5O_8:Cr^{3+}$," 1969, *Physics Letters*, 30A(3):189-190.
Grinberg et al., "Crystal field distribution and non-radiative transitions in $Cr^{3+}$-doped gallogermanates," *J. of Luminescence*, 1997, 72-74:193-194.
International Search Report issued on Jun. 7, 2011, in International Application No. PCT/US2010/049631. 4 pages.
Written Opinion of the International Search Authority, issued on Jun. 7, 2011 in International Application No. PCT/US2010/049631. 4 pages.
International Preliminary Report on Patentability mailed May 4, 2012, Patent Application No. PCT/US2010/049625.
International Search Report/Written Opinion mailed Oct. 6, 2011, Patent Application No. PCT/US2010/049625.
Kaminskii et al., Tunable stimulated emission of $Cr^{3+}$ ion and generation frequency self-multiplication effect in acentric crystals of La-gallogermanate structure ""*Inorg. Mater.*, 1988; 24:579-581.
Kaminskii et al., "Wide-band tunable stimulated emission from $La_3Ga_5SiO_{14}:Cr^{3+}$ crystal," *Inorg. Mater.*, 1987; 23:618.
Lin et al., "Luminescent properties of a new long afterglow $Eu^{2+}$ and $Dy^{3+}$ activated $Ca_3MgSi_2O_8$ phosphor," *J. Eur. Ceram. Soc.* 2001; 21:683-685.
Lenglet. "Ligand and field spectroscopy and chemical bonding in $Cr^{3+}$-, $Fe^{3+}$-, $Co^{2+}$- and $Ni^{2+}$-containing oxidic solids Influence of the inductive effect of the competing bonds and magnetic interactions on the degree of covalency of the 3d M-O bonds". 2000, *Materials Research Bulletin*. 35:531-543.
MacCraith et al., "Luminescence from lithium gallium oxide ($LiGa_5O_8$):chromium (3+) ion". *Journal of Luminescence*, 1981, 24-25(1):269-271.
MacFarlane et al., "$Cr^{3+}$ luminescence in calcium and strontium gallogermanate," *Optical Materials*, Feb. 1, 1994; 3(1):15-24.
Matsuzawa et al., "A new long phosphorescent phosphor with high brightness $SrAl_2O_4:Eu^{2+},Dy^{3+}$," 1996, *J. Electrochem Soc.*, 143(8):2670-2673.
Palilla et al., "Fluorescence properties of alkaline earth aluminates of the type $MAl_2O_4$ activated by divalent europium," *J. Electrochem Soc.*, 1968; 115(6):642-644.
Pan et al. "Sunlight-activated long-persistent luminescence in the near-infrared from $Cr^{3+}$-doped zinc gallogermanates," 2012, *Nature Materials*. 11:58-63, and Supplementary Information, pp. 1-16.
Rack et al., "$Eu^{+3}$ and $Cr^{+3}$ doping for red cathodoluminescence in $ZnGa_2O_4$," *J. Mater Res.*, 2001, 16(5):1429-1433.
Shionoya et al., "*Phosphor Handbook*", eds. Shionoya and Yen. Boca Raton, New York; p. 3. 2007.
Sosman et al., "New spectroscopic results of trivalent chromium in magnesium gallate," *J. Phys. Chem. Solid*, 2007; 68:22-25.
Sviridov et al. "Optical Spectra of nickel (2+) (3d8) ions in lithium gallate ($LiGa_5O_8$) and potassium zinc sulfate hexahydrate ($K_2Zn(SO_4)_2 \cdot 6H_2O$) crystals". 1988, *Zhurnal Prikladnoi Spektroskopii*, 49(5):851-853. English language Summary.
Wang et al., "$Mn^{2+}$ activated green, yellow and red long persistent phosphors," *J. Lumin*, 2003; 102-103:34-37.
Yamamoto et al., "Mechanism of long phosphorescence of $SrAl_2O_4:Eu^{2+},Dy^{3+}$ and $CaAl_2O_4:Eu^{2+},Nd^{3+}$," 1997, *J. Lumin*, 72-74:287-289.
"ZnO-based nanophosphors for tagging, tracking and locating," Grant No. N004315578. Office of Naval Research. Oct. 1, 2006-Sep. 30, 2009. Abstract. 1 page.

* cited by examiner

NEAR INFRARED DOPED PHOSPHORS HAVING A ZINC, GERMANIUM, GALLATE MATRIX

The present application is the §371 U.S. National Stage of International Application No. PCT/US2010/049625, filed 21 Sep. 2010, which claims the benefit of U.S. Provisional Application No. 61/244,247, filed Sep. 21, 2009, each of which are incorporated herein by reference in their entireties.

GOVERNMENT FUNDING

The present invention was made with government support under Grant No. ONR N00014-07-1-0060 from the Office of Naval Research. The Government has certain rights in this invention.

BACKGROUND

Phosphorescence is a phenomenon that the light emitted by a phosphor lasts after stoppage of excitation for duration of time sufficient for light to be perceived by the eye or a detection system, i.e., 0.1 second or longer. Phosphorescence that lasts for several hours at room temperature is called long-persistent phosphorescence. A phosphor that has long-persistent phosphorescence is called a long-persistent phosphor, or a long-lasting phosphor, or a long-afterglow phosphor.

Persistent phosphorescence was discovered in the 11$^{th}$ century in China and Japan and in the 16$^{th}$ century in Europe. In persistent phosphors, two kinds of active centers are involved: emitters and traps. Emitters are centers capable of emitting radiation after being excited. Traps do not emit radiation, but store excitation energy by trapping electrons and holes and release it gradually to the emitter due to thermal stimulation. Emitters are usually a small amount of intentionally added impurity atoms or ions. Co-activators are often intentionally added to form new trapping centers to improve the persistence time and intensity of the phosphors.

The importance of persistent phosphorescence was recognized since 1960s, and various persistent phosphors in the visible spectrum have been developed since then. Known in the art of long-persistent phosphors are sulfides, aluminates, and silicates.

The first generation long-persistent phosphors, sulfides [such as ZnS:Cu (green), CaS:Bi (blue), and CaS:Eu,Tm (red)] have been practically used for several decades. The disadvantages for sulfide phosphors include short persistence duration (e.g., three hours at the longest) and instability when ultraviolet light and moisture coexist. For these reasons, the sulfides have found only limited applications such as in luminous watch and night-time display inside a house.

Recently, aluminate-based long-persistent phosphors attracted considerable attention because of their better chemical stability, higher brightness, and longer persistence time (e.g., up to 20 hours) compared to the sulfide-based phosphors. Aluminate-based long-persistent phosphors are available in green and blue regions. The popular green aluminate phosphors include $SrAl_2O_4:Eu^{2+}$ and $SrAl_2O_4:Eu^{2+},Dy^{3+}$. Known blue aluminate persistent phosphors include $CaAl_2O_4:Eu^{2+},Nd^{3+}$ and $SrAl_4O_7:Eu^{2+},Pr^{3+}/Dy^{3+}$. The main drawback of these alkaline earth aluminates is that when they contact with moisture and water, hydrolysis reaction occurs quickly, which limits the out-door applications of these phosphors.

Another popular long-persistent phosphor is silicates, which are potential alternatives for the aluminates. The silicate-based phosphors include $(Sr_{2-x}Ca_x)MgSi_2O_7:Eu^{2+},Dy^{3+}$ with emission tunable from cyan to blue, green, and to yellow; $Ca_3MgSi_2O_8:Eu^{2+},Dy^{3+}$ with afterglow band at 475 nm; $MgSiO_3:Eu^{2+},Dy^{3+},Mn^{2+}$ with emission at 660 nm; and $Ca_{0.2}Zn_{0.9}Mg_{0.9}Si_2O_6:Eu^{2+},Dy^{3+},Mn^{2+}$ with emission at 690 nm.

From the above list, it can be seen that all the persistent phosphors developed up to now are in the visible region. Some of these visible persistent phosphors (such as $SrAl_2O_4:Eu^{2+},Dy^{3+}$) have been commercialized and widely used for security signs, emergency signs, safety indication, indicators of control panels, and detection of high energy rays, and so on. In contrast, no persistent phosphors in the infrared or near infrared region are available in market.

Infrared or near infrared long-persistent phosphors have gained considerable attention in recent years because of strong military and security demands. For surveillance in night or dark environments, infrared or near infrared emitting taggants are generally used for tagging, tracking, and locating the targets of interest. For practical military and security applications, it is desirable for the taggants to possess one or more of the following characteristics. (1) The emission from the taggants should be in infrared or near infrared spectrum, which is invisible to naked eyes but is detectable to specific infrared detection devices (such as night vision goggles) from far distance. (2) The infrared or near infrared emission from the taggants should be persistent for more than 10 hours (overnight) without additional charging (excitation). Ideally, the taggants can be repeatedly charged by solar radiation in daytime. (3) The taggants should be stable enough to withstand various out-door application environments including applications in water. (4) The taggants should be able to be inserted almost anywhere, including into liquid solution, dyes, paints, inks, epoxies, and sol-gel, which can then be coated onto almost any surface for concealment. (5) The production of the phosphors should be easy and cheap. Unfortunately, up to now, no such infrared or near infrared taggants have been available.

In design of infrared or near infrared phosphors, transition metal chromium in trivalent state (i.e., $Cr^{3+}$) and nickel in divalent state ($Ni^{2+}$) were widely used as the luminescent centers. Chromium can emit a narrow luminescence band around 696 nm due to the transition of $^2E \rightarrow ^4A_2$, or a wide band in the near infrared region related to the transition of $^4T_2 \rightarrow ^4A_2$, which strongly depend on the crystalline field strength of the host. When crystal field is strong, the first excited state will be $^2E$ term and causes luminescence properties of the materials like in $Al_2O_3$ (ruby). In weak crystal field, $^4T_2$ term will become lowest excited state and causes broad band emission like in $BeAl_2O_4$ (alexandrite). Since the $^2E \rightarrow ^4A_2$ transition is a spin-forbidden transition, the lifetime is of the order of milliseconds. On the other hand, the lifetime of wide band emission, which is spin-allowed, is around microseconds. Nickel has a complicated emission spectrum due to the appearance of emission transitions from more than one level. The emission spectra of $Ni^{2+}$ in the octahedral site for garnets such as $Y_3Al_5O_{12}$ and $Gd_3Sc_2Ga_3O_{12}$ consists of three bands in near infrared due to $^3T_2 \rightarrow ^3A_2$ transition. At room temperature, the bands are broad with a maximum at 1360 nm in $Y_3Al_5O_{12}$, 1450 nm in $Gd_3Sc_2Ga_3O_{12}$, and 1200 nm in $MgAl_2O_4$.

It has been reported that some $Cr^{3+}$ doped gallates showed strong emission in the infrared. The reported gallates include $La_3Ga_5GeO_{14}:Cr^{3+}$, $La_3Ga_5SiO_{14}:Cr^{3+}$, $Li(Ga,Al)_5O_8:Cr^{3+}$, and $MgGa_2O_4:Cr^{3+}$. But no afterglow phenomenon was reported.

SUMMARY

In one aspect, the present disclosure provide a phosphor including a material of the formula: $Zn_xGa_yGe_zO_{(x+(3y/2)+2z)}$:

tC, mR, wherein a portion of Ga may optionally be replaced with a Group IIIA metal (e.g., Al and/or In); wherein a portion or all of Ge may optionally be replaced with a Group IVA metal (e.g., Si and/or Sn); and wherein C is $Cr^{3+}$, $Ni^{2+}$, or a combination thereof; R is an ion selected from a group consisting of alkaline earth ions (e.g., $Mg^{2+}$, $Ca^{2+}$, $Sr^{2+}$, and/or $Ba^{2+}$), lanthanide ions (e.g., $La^{3+}$, $Ce^{3+}$, $Pr^{3+}$, $Nd^{3+}$, $Eu^{3+}$, $Gd^{3+}$, $Tb^{3+}$, $Dy^{3+}$, $Ho^{3+}$, $Er^{3+}$, $Tm^{3+}$, $Yb^{3+}$, and/or $Lu^{3+}$), $Li^+$ ions, and combinations thereof; x is 1 to 5 (e.g., an integer from 1 to 5); y is 1 to 5 (e.g., an integer from 1 to 5); z is 1 to 5 (e.g., an integer from 1 to 5); t is 0.01 to 5 and represents mol % based on the total moles of Ga and any replacements thereof; and m is 0 to 5 and represents mol % based on the total moles of Ga and any replacements thereof. In some preferred embodiments, t is 0.05 to 2 and represents mol % based on the total moles of Ga and any replacements thereof. In other preferred embodiments, m is 0 to 2 and represents mol % based on the total moles of Ga and any replacements thereof. For embodiments in which C is $Cr^{3+}$, the phosphor can have emission band peaks at 690 to 1100 nm. For embodiments in which C is $Ni^{2+}$, the phosphor can have emission band peaks at 1100 to 1550 nm. For embodiments in which C is a combination of $Cr^{3+}$ and $Ni^{2+}$, the phosphor can have emission band peaks at 690 to 1100 nm and 1100 to 1550 nm.

In certain embodiments, a phosphor as disclosed herein can be capable of being activated by one or more of solar radiation, ultraviolet lamp, fluorescent lamp, and light emitting diode (LED) light. In some embodiments, the solar radiation includes diffused light and direct sunlight in an outdoor environment (e.g., a sunny day, a cloudy day, or a rainy day) that may include an open area, a shadow of a tree, or a shadow of a building. In preferred embodiments, the phosphor is capable of being activated for a time between sunrise and sunset. In preferred embodiments, the phosphors disclosed herein can be quickly charged by solar radiation, ultraviolet light, and fluorescent lamp light: e.g., less than 1 minute of excitation can result in up to 400 hours of continuous near infrared emission.

In certain embodiments, a phosphor as disclosed herein can be capable of being activated in one or more of air, tap water, salt water, seawater, bleach water, and bleach-salt-sodium bicarbonate ($NaHCO_3$) aqueous solution. In preferred embodiments, a phosphor as disclosed herein is chemically stable in one or more of air, tap water, salt water, seawater, bleach water, and bleach-salt-sodium bicarbonate ($NaHCO_3$) aqueous solution.

In preferred embodiments, an emission from an activated phosphor as disclosed herein can persist for up to 400 hours after excitation.

A phosphor as disclosed herein can be in the form of, for example, a powder (e.g., typically a white powder), a ceramic, or nanoparticles. For embodiments in which the phosphor is a powder, the powder can be mixed with water-based or oil-based paints to form a luminescent paint. Water-based luminescent paints include, for example, general indoor-uses wall paints. Oil-based luminescent paints include, for example, oil-based resins (e.g., epoxy resins, polyurethane resins, polyester resins, acrylic acid resins, and/or hydroxyl acrylic acid resins) and/or varnishes (e.g., amino varnishes, acrylic polyurethane coatings, and/or transparent alkyd coatings). Such luminescent paints can be capable of being activated by, for example, one or more of solar radiation, an ultraviolet lamp, and a fluorescent lamp, and can have emission band peaks at 690 to 1100 nm for $Cr^{3+}$-activated phosphors and/or 1100 to 1550 nm for $Ni^{2+}$-activated phosphors. In preferred embodiments, the emission can persist for up to 400 hours after excitation. Thus, the present disclose provides luminescent paints that include phosphors as disclosed herein, which can provide the paints or inks with the function of near infrared luminescence in the dark.

The present disclosure also provides method of activating a phosphor. Such methods include providing a phosphor as disclosed herein and exposing the phosphor to one or more of solar radiation, an ultraviolet lamp, a fluorescent lamp, and a light emitting diode (LED) light.

The present disclosure also provides activated phosphors. The activated phosphors include a phosphor as disclosed herein that has been exposed to one or more of solar radiation, an ultraviolet lamp, a fluorescent lamp, and a light emitting diode (LED) light. In preferred embodiments, the activated phosphor has an emission that persists for up to 400 hours after excitation.

The phosphors disclosed herein can be used in a variety of applications, e.g., in luminous paints, as near infrared lighting sources, and for night vision devices and manufactures.

DEFINITIONS

As used herein, "a," "an," "the," and "at least one" are used interchangeably and mean one or more than one.

As used herein, the term "comprising," which is synonymous with "including" or "containing," is inclusive, open-ended, and does not exclude additional unrecited elements or method steps.

In traditional definition, the persistence of phosphorescence of visible phosphors is measured as persistence time which is the time, after discontinuing irradiation, that it takes for phosphorescence of a sample to decrease to the threshold of eye sensitivity. See, for example, U.S. Pat. No. 6,953,536 B2 (Yen et al.). This threshold is the signal level of emission intensity that a naked eye can clearly see in the dark. For infrared phosphors, however, this definition is no longer valid because the infrared signal is invisible to unaided eye. The persistence time for infrared phosphors should then be determined by the sensitivity of the detection systems such as nigh vision goggles, infrared cameras, or infrared detectors. As used herein, the persistence time of infrared phosphors is the time that it takes for an eye can see with the aid of a Generation III night vision goggle in a dark room. In addition, the decay of the phosphorescence intensity is measured by a FluoroLog3-2iHR320 spectrofluorometer.

The above brief description of various embodiments of the present invention is not intended to describe each embodiment or every implementation of the present invention. Rather, a more complete understanding of the invention will become apparent and appreciated by reference to the following description and claims in view of the accompanying drawings. Further, it is to be understood that other embodiments may be utilized and structural changes may be made without departing from the scope of the present invention.

DETAILED DESCRIPTION OF ILLUSTRATIVE EMBODIMENTS

Figure 1:
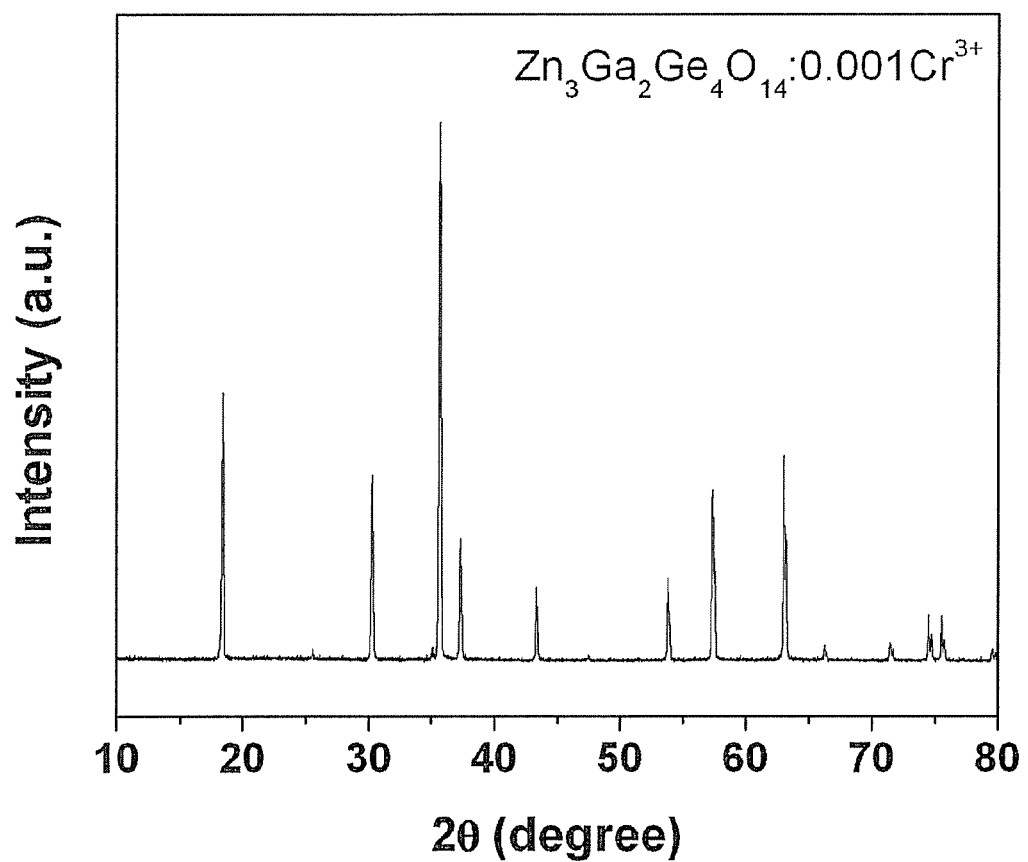
FIG. 1 shows the x-ay diffraction pattern of exemplary $Zn_3Ga_2Ge_4O_{14}$:$0.001Cr^{3+}$ phosphors.

This disclosure relates to long-persistent near infrared phosphors. Phosphors disclosed herein are based on doping of an activator (an emitter) into a host matrix. In particular, the compositions include zinc germanium gallate phosphors doped with $Cr^{3+}$ or $Ni^{2+}$ ions with persistent infrared phosphorescence as long as 400 hours. The wavelength of the emission peak can be 690 to 1100 nm (for $Cr^{3+}$) and/or 1100 to 1550 nm (for $Ni^{2+}$). The intensity of the afterglow and persistent time were improved by co-doping proper alkaline earth or lanthanide or $Li^+$ trapping ions.

The phosphors disclosed herein include a zinc germanium gallate matrix activated with $Cr^{3+}$ or $Ni^{2+}$ and codoped with certain alkaline earth metal ions, or lanthanide metal ions, or $Li^+$ ion. The phosphors can be activated with 0.01 mol % to 5 mol % (preferably 0.1 mol % to 1.0 mol %) of $Cr^{3+}$ or $Ni^{3+}$ activators and codoped with 0 to 5 mol % (preferably 0 to 1.0 mol %) of at least one alkaline earth metal ion (e.g., $Mg^{2+}$, $Ca^{2+}$, $Sr^{2+}$, $Ba^{2+}$), or one lanthanide metal ion (e.g., $La^{3+}$, $Ce^{3+}$, $Pr^{3+}$, $Nd^{3+}$, $Eu^{3+}$, $Gd^{3+}$, $Tb^{3+}$, $Dy^{3+}$, $Ho^{3+}$, $Er^{3+}$, $Tm^{3+}$, $Yb^{3+}$, $Lu^{3+}$), or $Li^+$ ion. The activator and dopant concentration are measured in terms of mol % relative to Ga.

In one embodiment, the phosphors disclosed herein include a material of the formula: $Zn_xGa_yGe_zO_{(x+(3y/2)+2z)}$:tC, mR, wherein a portion of Ga may optionally be replaced with a Group IIIA metal (e.g., Al and/or In); wherein a portion or all of Ge may optionally be replaced with a Group IVA metal (e.g., Si and/or Sn); and wherein C is $Cr^{3+}$, $Ni^{2+}$, or a combination thereof; R is an ion selected from a group consisting of alkaline earth ions (e.g., $Mg^{2+}$, $Ca^{2+}$, $Sr^{2+}$, and/or $Ba^{2+}$), lanthanide ions (e.g., $La^{3+}$, $Ce^{3+}$, $Pr^{3+}$, $Nd^{3+}$, $Eu^{3+}$, $Gd^{3+}$, $Tb^{3+}$, $Dy^{3+}$, $Ho^{3+}$, $Er^{3+}$, $Tm^{3+}$, $Yb^{3+}$, and/or $Lu^{3+}$), $Li^+$ ions, and combinations thereof; x is 1 to 5 (e.g., an integer from 1 to 5); y is 1 to 5 (e.g., an integer from 1 to 5); z is 1 to 5 (e.g., an integer from 1 to 5); t is 0.01 to 5 and represents mol % based on the total moles of Ga and any replacements thereof; and m is 0 to 5 and represents mol % based on the total moles of Ga and any replacements thereof.

Preferred phosphors disclosed herein are those in which x=3, y=2, and z=3, 4, or 5. Preferred phosphor hosts disclosed herein are therefore $Zn_3Ga_2Ge_3O_{12}$, $Zn_3Ga_2Ge_4O_{14}$, and $Zn_3Ga_2Ge_5O_{16}$.

Phosphors disclosed herein are preferably activated with $Cr^{3+}$ or $Ni^{2+}$ and codoped with an ion selected from a group consisting of alkaline earth metal ions (e.g., $Mg^{2+}$, $Ca^{2+}$, $Sr^{2+}$, $Ba^{2+}$), lanthanide metal ions (e.g., $La^{3+}$, $Ce^{3+}$, $Pr^{3+}$, $Nd^{3+}$, $Eu^{3+}$, $Gd^{3+}$, $Tb^{3+}$, $Dy^{3+}$, $Ho^{3+}$, $Er^{3+}$, $Tm^{3+}$, $Yb^{3+}$, $Lu^{3+}$), and $Li^+$ ion. Codoping results in phosphors of improved brightness and persistence times.

Phosphors disclosed herein also include those in which $Ga^{3+}$ is partially replaced with a Group IIIA metal ion (e.g., $Al^{3+}$ or $In^{3+}$) or in which $Ge^{4+}$ is partially or fully substituted with a IVA metal ion (e.g., $Si^{4+}$ or $Sn^{4+}$) in the matrix. These substitutions are believed to effect charge compensation.

Phosphor materials disclosed herein can preferably exhibit superior phosphorescence intensity and long persistence of phosphorescence. Persistence of phosphorescence is estimated herein as persistence time which is the time after discontinuing irradiation that it takes for phosphorescence of a sample to decrease to the threshold of the sensitivity of a Generation III night vision goggles in the dark. The tendency of the phosphorescence decay is also assessed by a FuoroLog3-2iHR320 spectrofluorometer by following the phosphorescence intensity as a function of time. All the measurements and assessments were performed wider identical conditions using the same detection systems. Materials disclosed herein can preferably exhibit persistence time up to 400 hours or more. It is generally the case that phosphors having longer persistence times are more preferred.

The hosts disclosed herein include zinc germanium gallates $Zn_xGa_yGe_zO_{(x+(3y/2)+2z)}$, wherein x is a value from 1 to 5, y is a value from 1 to 5, z is a value from 1 to 5. Hosts where x=3, y=2, and z=3, 4, or 5 are more preferred. The more preferred hosts are therefore $Zn_3Ga_2Ge_3O_{12}$, $Zn_3Ga_2Ge_4O_{14}$, and $Zn_3Ga_2Ge_5O_{16}$.

The activator employed in the phosphors disclosed herein includes $Cr^{3+}$ or $Ni^{2+}$ or a combination of both. The $Cr^{3+}$-activated phosphors have phosphorescent bands at 690 nm to 1100 nm. The adding of $Ni^{2+}$ ion creates an emission band at 1100-1550 nm. The concentration of the activator is preferably provided with an amount which is sufficient to produce a phosphor having high phosphorescence intensity and long persistence time. The preferred concentration of the activator in the phosphors disclosed herein is 0.1 mol % to 1.0 mol %, which is measured in term of mol % relative to Ga.

This disclosure demonstrates that doping of an alkaline earth metal ion (e.g., $Mg^{2+}$, $Ca^{2+}$, $Sr^{2+}$ or $Ba^{2+}$), or a lanthanide ion (e.g., $La^{3+}$, $Ce^{3+}$, $Pr^{3+}$, $Nd^{3+}$, $Eu^{3+}$, $Gd^{3+}$, $Dy^{3+}$, $Ho^{3+}$, $Er^{3+}$, $Tm^{3+}$, $Yb^{3+}$, or $Lu^{3+}$), or $Li^+$ ion into the host matrix disclosed herein can result in phosphors having improved phosphorescence brightness and persistence time. It is believed that these dopants can create proper trapping centers in the matrix, which can store excitation energy and release gradually to the emitter. The preferred concentration of the dopant is 0 to 2.0 mol %, which is measured in term of mol % relative to Ga.

Phosphors disclosed herein also include those in which a portion of $Ga^{3+}$ in the host is replaced with a trivalent Group IIIA metal ion ($R^{3+}$) such as $Al^{3+}$ or $In^{3+}$. The preferred $R^{3+}/Ga^{3+}$ ratio is from 0.1 to 0.5.

Phosphors disclosed herein also include those in which a portion or all of $Ge^{4+}$ in the host is replaced with a tetravalent Group IVA metal ion ($R^{4+}$) such as $Si^{4+}$ or $Sn^{4+}$. The preferred $R^{4+}/Ge^{4+}$ ratio is from 0.1 to 1.0.

This disclosure exemplifies phosphors in powder and ceramic fauns prepared by combing the host, activator and dopant. The phosphors disclosed herein can be made by the following general solid-state reaction method, preferably providing particles that are typically 10 micrometers or larger. The phosphor components are combined as indicated in stoichiometric formulas. The raw materials are mixed and ground to fine powder followed by prefiring at 800-1000° C. in air for 2-4 hours. The prefired material is again ground to fine powder. The prefired powder is preferably pressed into ceramic disks with diameters varying from 15 mm to 70 mm. The powder or disks are then sintered at 1100-1350° C. for 2-4 hours in air.

The phosphors disclosed herein can preferably be effectively activated by a wide range of excitation sources including solar radiation (including diffuse light), direct sunlight, ultraviolet lamp, fluorescent lamp, and LED light.

The phosphors disclosed herein can preferably be effectively activated by the above mentioned excitation sources in various medium including in air, tap water, salt water (same NaCl concentration as the sea water), bleach water, and bleach-salt-sodium bicarbonate ($NaHCO_3$) aqueous solution. The samples excited in these aqueous medium preferably have similar excitation, emission, and persistence performance as those excited in air under the same excitation source.

The phosphors disclosed herein can preferably be effectively activated by solar radiation in various weathering conditions including in sunny day, partly cloudy day, heavy cloudy day, rainy day, and heavy rainy day.

The phosphors disclosed herein can preferably be effectively activated by solar radiation at any outdoor locations including in open area under any weathering conditions, in the shadow of trees, and in the shadow of buildings under any weathering conditions.

The phosphors disclosed herein can preferably be effectively activated by solar radiation at anytime of the day, including the moment before sunrise and after sunset, as long as the outside is visible.

The phosphors disclosed herein can preferably be quickly charged by the above mentioned excitation sources. For example, the energy stored during less than 1 minute of excitation by solar radiation and ultraviolet lamp can sustain up to 400 hours of continuous near infrared emission. Such charging (light absorption-light emission) can preferably be recycled indefinitely.

The phosphors disclosed herein are preferably extremely chemically stable in outdoor application environments including such severe environments as in water, sea water, swimming pool water, and sawing water. The samples immersed in the above water for six months can exhibit the same excitation, emission, and persistence performance as the fresh ones.

The powder phosphors disclosed herein can be incorporated into various water-based and oil-based paints to form near infrared luminescent paints or inks. This can preferably endow the paints or inks with the function of near infrared luminescence in the dark. The water-based paints are preferably regular indoor-used wall paints. The quantity of the phosphor powder added to the water-based paint is typically 10 wt. % to 50 wt. %, preferably 20 wt. % to 30 wt. %. The oil-based paints are mainly transparent or colorless resins and varnish. The preferred resins include epoxy resin, polyurethane resin, polyester resin, acrylic acid resin, and hydroxyl acrylic acid resin. The preferred varnish includes amino varnish, acrylic polyurethane coating, and transparent alkyd coating. The quantity of the phosphor powder added to the resins or varnish is typically 10 wt. % to 50 wt. %, preferably 20 wt. % to 30 wt. %.

In making the oil-based near infrared illuminating paints, organic solvent and auxiliary agents are usually added to improve the paint's viscosity and fluidity. The organic solvents can include monohydric alcohols (such as ethanol, methanol, and isopropyl alcohol) and glycols (such as ethylene glycol and propylene glycol). The agents are mainly dispersing agents (such as methyl xylene solution) and sediment-free agents (such as silica fine powders).

For small amount of usage, the phosphor powders, organic solvent, and agents can be mixed manually using a glass rod. For large amount of usage, a high-speed mixer can be used to mix these components. The preferred mixing procedure using a mixer is as follows. Certain amount of resin (or varnish), organic solvent, and dispersing agent are added into a container. The mixer is then turned on and the sediment-free agent and phosphor powders are added slowly. The mixer continues to spin until the phosphor powders are uniformly dispersed in the paint.

The paints and inks can be applied to any surfaces including rocks, building walls, trees, highways, runways, planes, ships, vehicles, machines, clothes, helmets, weapons, boards, control panels, etc.

The phosphors disclosed herein can also preferably be incorporated into transparent silicone rubbers and plastics, endowing the rubbers and plastics with the function of near infrared luminescence in the dark. Significantly, the near infrared luminescent silicone rubbers can exhibit a good degree of deformability without cracking.

The phosphors disclosed herein can preferably be used as invisible (by naked eye) illumination source and identification markers in the dark for military, security, and forensic related applications. For example, the markers (combat ID) made from the phosphors disclosed herein can be attached onto the soldier's cloth or helmet, which can be recognized and monitored by a night vision goggles for tracking and locating purposes. The phosphors can be used either as solid ceramic or luminescent paints or inks.

The phosphors disclosed herein can also be used as identification markers in the dark for rescue purposes. For example, a wreckage ship painted with the phosphors disclosed herein can be easily found with a night vision device from a rescue helicopter. Another example is mine rescue. The miners with their helmets and cloths painted with the phosphors disclosed herein can be easily searched with a night vision goggles.

Due to their superior capability in absorbing solar radiation and their ability in converting the solar energy into near infrared photons, the phosphors disclosed herein may also be used to improve the efficiency, effectiveness and productivity of the widely deployed Si solar cells. This is because the near infrared photons (from 690 nm to 1100 nm for $Cr^{3+}$ activated phosphors, which corresponds to 1.1-1.8 eV in electron volts) emitted by the phosphors correspond to an optimum spectral response of the Si solar cells (band gap is approximately 1.1 eV). The possible routes include: (1) making cover glass that contains the phosphors disclosed herein; and (2) coating the cover glass and the silicon cell panels with the phosphors disclosed herein by sputtering coating.

The nanoparticles disclosed herein may be used as an optical probe for in vivo bio-imaging. Due to the long afterglow, the probes can be excited before injection. This can avoid the tissue autofluorescence under external illumination and thus can remove the background noise originating from the in situ excitation. In addition, the skin and tissues are transparent to near infrared light, allowing deep tissue imaging.

The following examples are offered to further illustrate various specific embodiments and techniques of the present invention. It should be understood, however, that many variations and modifications understood by those of ordinary skill in the art may be made while remaining within the scope of the present invention. Therefore, the scope of the invention is not intended to be limited by the following examples.

EXAMPLES

Example 1

Method of Preparation of Near Infrared Phosphors with Host Materials 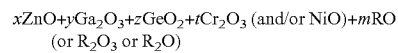

Phosphor components are mixed according to the molar proportions in the following general recipes:

$$xZnO+yGa_2O_3+zGeO_2+tCr_2O_3 \text{ (and/or NiO)}+mRO$$
$$\text{(or } R_2O_3 \text{ or } R_2O\text{)}$$

where, preferably x=1 to 5 and more preferably x is integer 1, 2, 3, 4, or 5; preferably y=1 to 5 and more preferably y is integer 1, 2, 3, 4, or 5; preferably z=1 to 5 and more preferably z is integer 1, 2, 3, 4, or 5; preferably t=0.001 to 0.05 relative to $Ga_2O_3$ and more preferably t=0.001 to 0.02; preferably m is a number ranging from 0 to 0.05 and more preferably m=0 to 0.02; RO is an alkaline earth metal oxide (MgO, CaO, SrO, or BaO); $R_2O_3$ is an lanthanide metal oxide ($La_2O_3$, $Ce_2O_3$, $Pr_2O_3$, $Nd_2O_3$, $Eu_2O_3$, $Gd_2O_3$, $Tb_2O_3$, $Dy_2O_3$, $Ho_2O_3$, $Er_2O_3$, $Tm_2O_3$, $Yb_2O_3$, $Lu_2O_3$); $R_2O_3$ may also be $Bi_2O_3$; $R_2O$ is $Li_2O$.

The mixture of components is milled or ground to form a homogeneous fine powder for prefiring. The mixed powder is then prefired at 900° C. in air for 2 hours. The pre-fired material is again ground to fine powder suitable for sintering. The prefired powder is preferably pressed into ceramic disks with diameters varying from 15 mm to 75 mm, preferably the diameter is 15 mm. The powder or disks are then sintered at 1250° C. in air for 2-4 hours. The resulting materials exhibit phosphor properties as described herein.

Example 2

Preparation and Characterization of $Zn_3Ga_2Ge_4O_{14}$: $Cr^{3+}$ Phosphors

The methods and phosphors disclosed herein are specifically exemplified by preparation of $Zn_3Ga_2Ge_4O_{14}$:$Cr^{3+}$ ($Cr^{3+}$-doped zinc germanium gallate) phosphors.

$Zn_3Ga_2Ge_4O_{14}$:$0.001Cr^{3+}$ phosphor was prepared by the general method of Example 1 mixing the components in the following molar proportions:

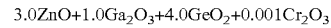

The optical measurements were mainly carried out on the disk samples.

FIG. 1 is the x-ay diffraction pattern of the $Zn_3Ga_2Ge_4O_{14}$: $0.001Cr^{3+}$ sample.

Figure 2:
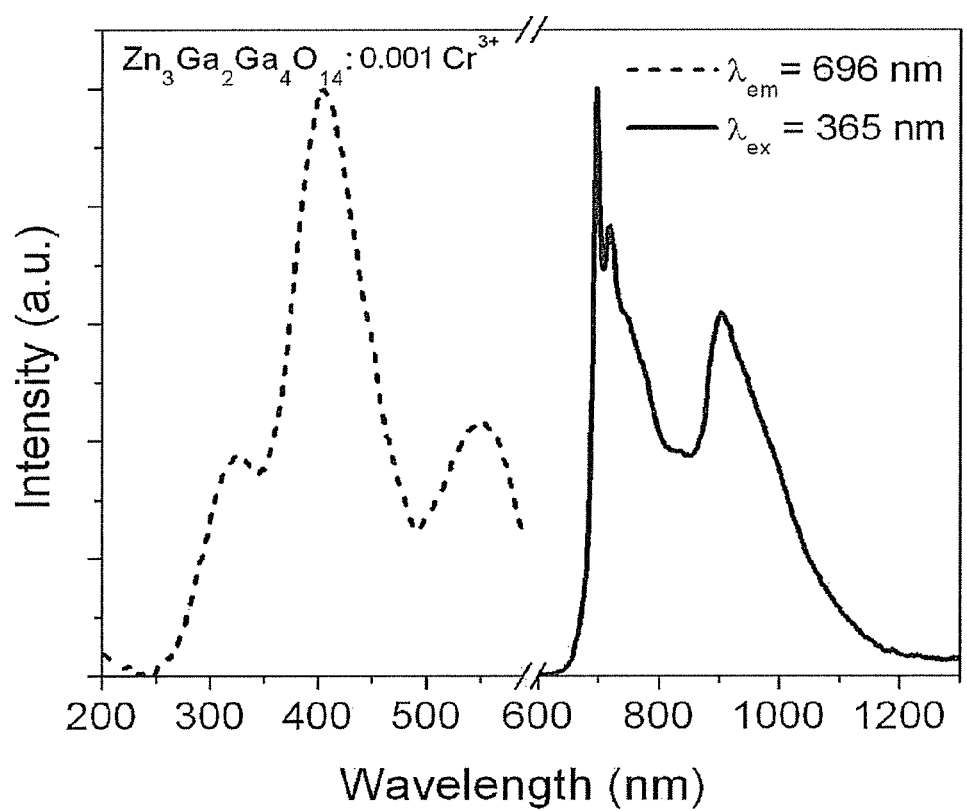
FIG. 2 shows the excitation and emission of exemplary $Zn_3Ga_2Ge_4O_{14}$:$0.001Cr^{3+}$ phosphors detected by a GaInAs infrared detector where the excitation spectrum was monitored at 696 nm.

FIG. 2 presents the excitation and emission of $Zn_3Ga_2Ge_4O_{14}$:$0.001Cr^{3+}$ phosphors detected by a GaInAs infrared detector where the excitation spectrum was monitored at 696 nm.

Figure 3:
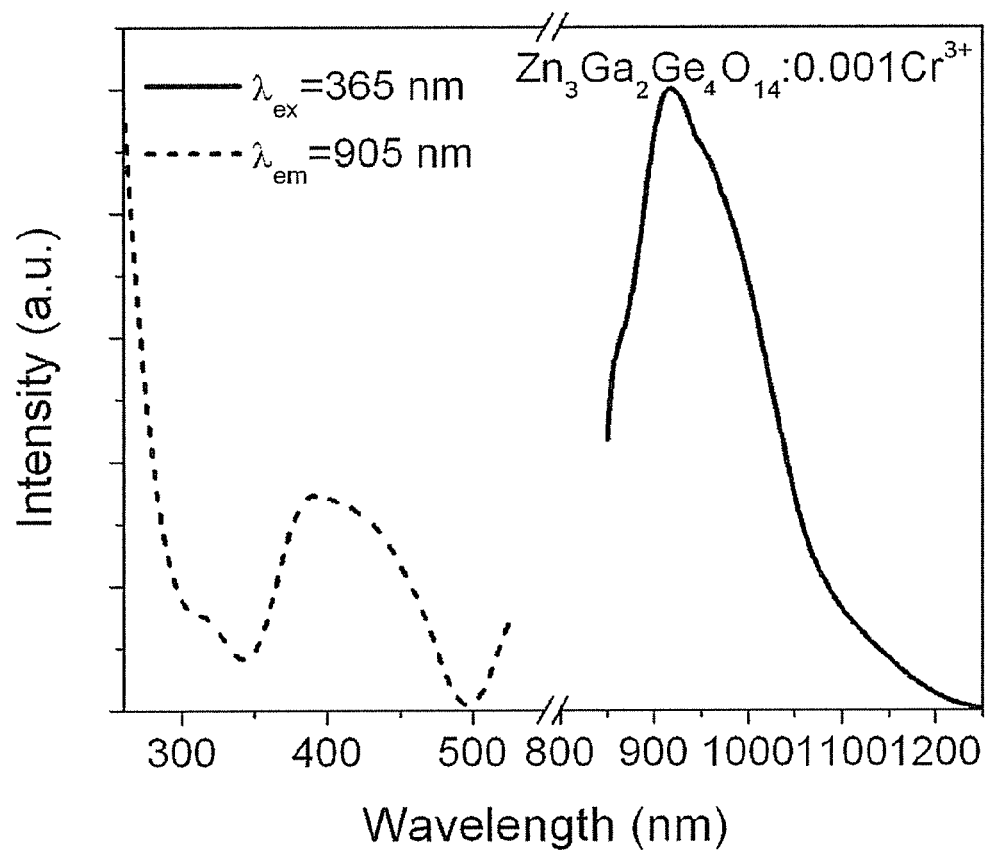
FIG. 3 shows the excitation and emission of exemplary $Zn_3Ga_2Ge_4O_{14}$:$0.001Cr^{3+}$ phosphors detected by a GaInAs infrared detector where the excitation spectrum was monitored at 905 nm.

FIG. 3 presents the excitation and emission of $Zn_3Ga_2Ge_4O_{14}$:$0.001Cr^{3+}$ phosphors detected by a GaInAs infrared detector where the excitation spectrum was monitored at 905 nm.

Figure 4:
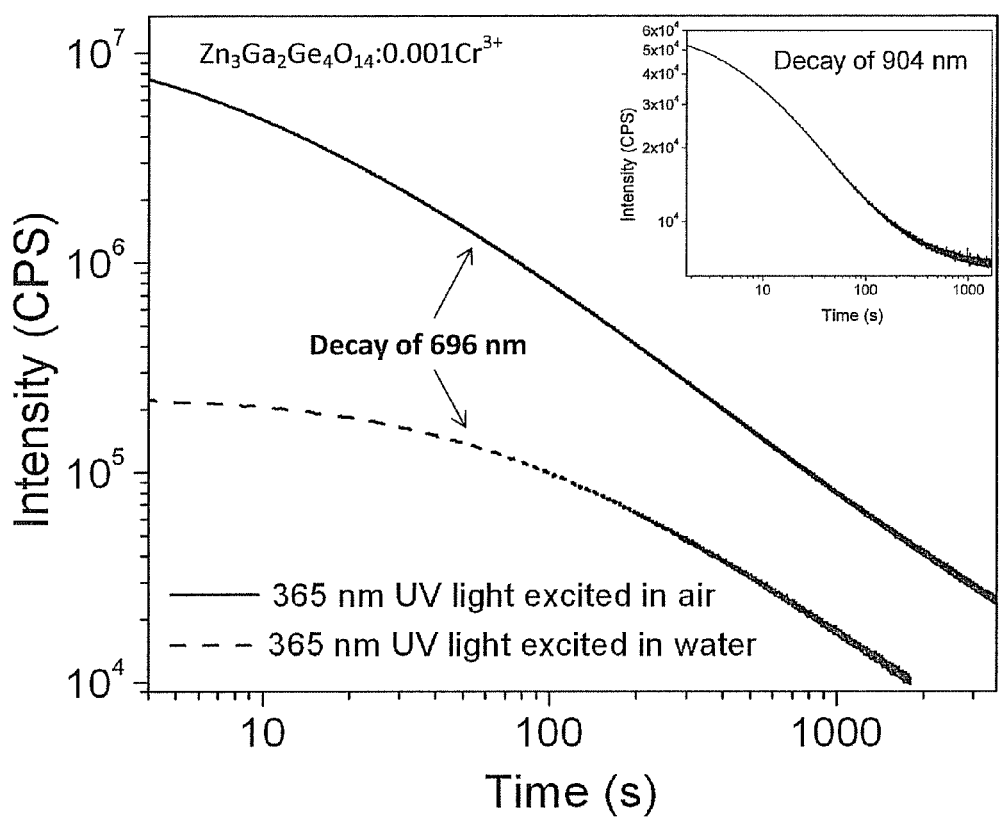
FIG. 4 shows the decay curves of the afterglow (at 696 nm and 905 nm) of exemplary $Zn_3Ga_2Ge_4O_{14}$:0.001$Cr^{3+}$ exposed to a 4 W 365 nm ultraviolet lamp for 5 minutes with the samples either in air or in water.

FIG. 4 shows the decay curves of the afterglow of $Zn_3Ga_2Ge_4O_{14}$:$0.001Cr^{3+}$ samples exposed to a 4 W 365 nm wavelength ultraviolet lamp for 5 minutes with the samples either in air or in water. The decays were monitored at 696 nm and 905 nm (inset) for the case in air and at 696 nm for the case in water.

Figure 5:
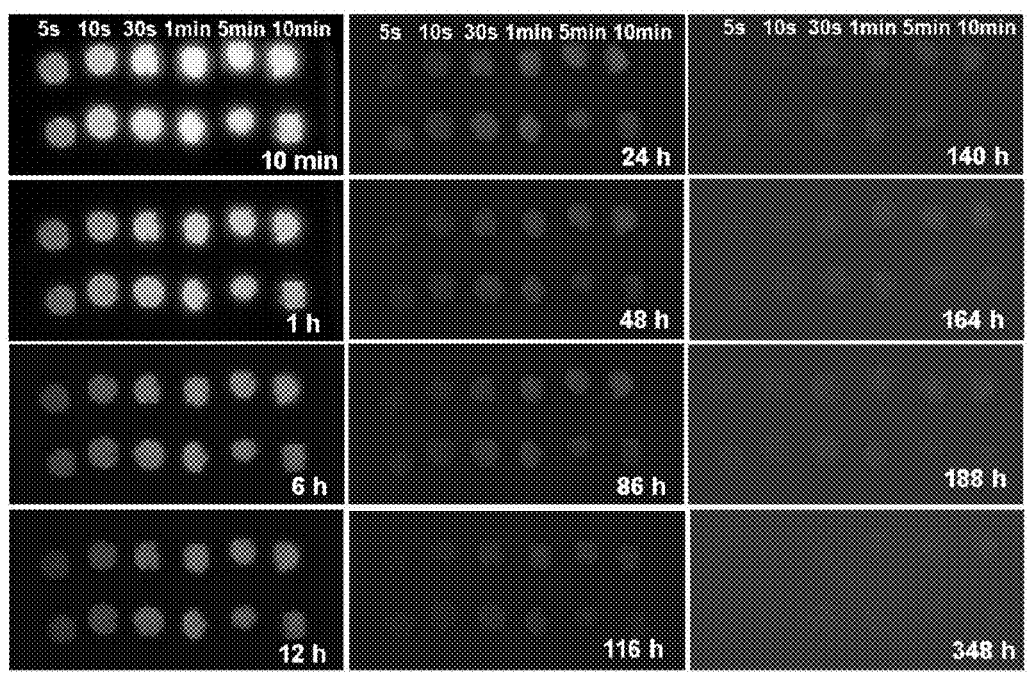
FIG. 5 shows the near infrared images of the afterglow of exemplary $Zn_3Ga_2Ge_4O_{14}$:0.001$Cr^{3+}$ phosphor disks exposed to a 365 nm ultraviolet lamp for 5 s, 10 s, 30 s, 1 minute, 5 minutes, and 10 minutes. The afterglow can last up to 400 hours.

FIG. 5 shows the images of the afterglow of twelve (12) $Zn_3Ga_2Ge_4O_{14}$:$0.001Cr^{3+}$ phosphor disks (diameter: 19 mm) exposed to a 365 nm ultraviolet lamp for 5 seconds, 10 seconds, 30 seconds, 1 minute, 5 minutes, and 10 minutes. The images were taken by a digital camera via a Generation III night vision monocular in a dark room. The number at the bottom right corner of each image is the time after which the image was taken. After 348 hours afterglow, the near infrared emission could still be clearly observed by the night vision monocular and captured by the digital camera. These images clearly show that after a short excitation of 5 seconds with a 365 nm ultraviolet lamp, the energy stored in the disk could sustain the near infrared emission for up to 400 hours (more than 2 weeks). The results also clearly show that the samples after 30 seconds, 1 minute, 5 minutes, and 10 minutes excitation with a 365 nm ultraviolet lamp have similar phosphorescence brightness and persistence times.

Figure 6:
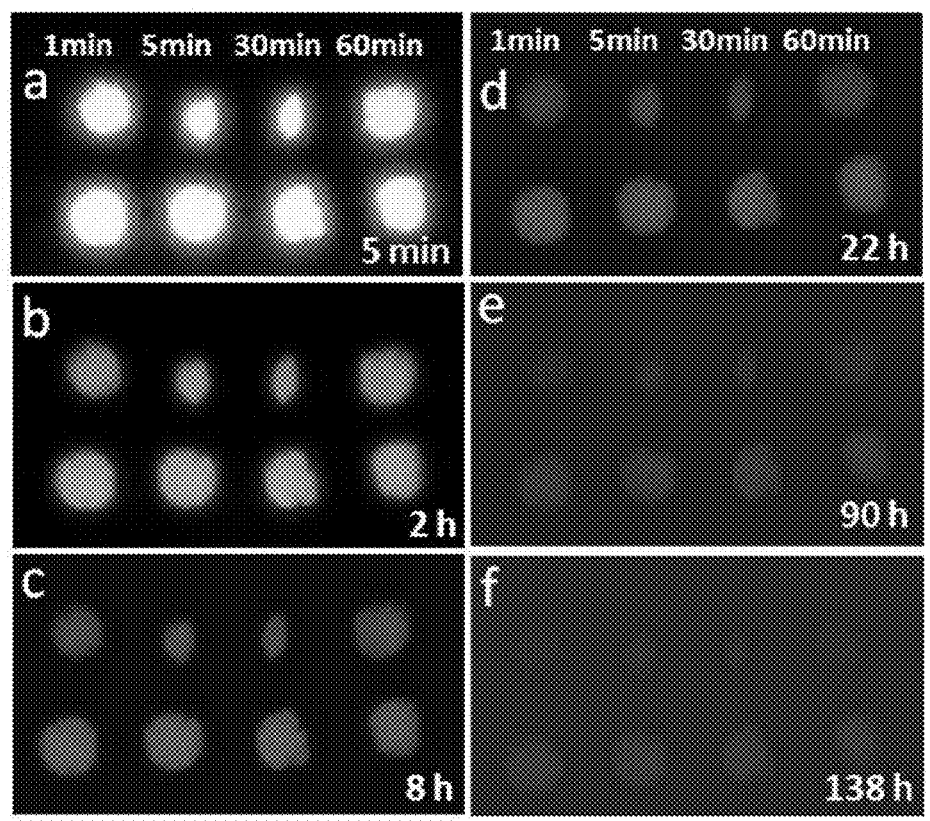
FIG. 6 shows the near infrared images of the afterglow of exemplary $Zn_3Ga_2Ge_4O_{14}$:0.001$Cr^{3+}$ phosphor disks exposed to sunlight for 1 minute, 5 minutes, 30 minutes, and 60 minutes.

FIG. 6 presents the images of the afterglow of eight (8) $Zn_3Ga_2Ge_4O_{14}$:$0.001Cr^{3+}$ phosphor disks (diameter: 19 mm) exposed to sunlight for 1 minute, 5 minutes, 30 minutes, and 60 minutes. The weather condition is fair sky/partly cloudy. The images were taken by a digital camera via a Generation III night vision monocular in a dark room. The number at the bottom right corner of each image is the time after which the image was taken. After 138 hours afterglow, the near infrared emission can still be clearly observed by the night vision monocular and captured by the digital camera. These images clearly show that the samples can be effectively excited by sunlight and that the samples after 1 minute, 5 minutes, 30 minutes, and 60 minutes sunlight excitation have similar phosphorescence brightness and persistence times.

Figure 7:
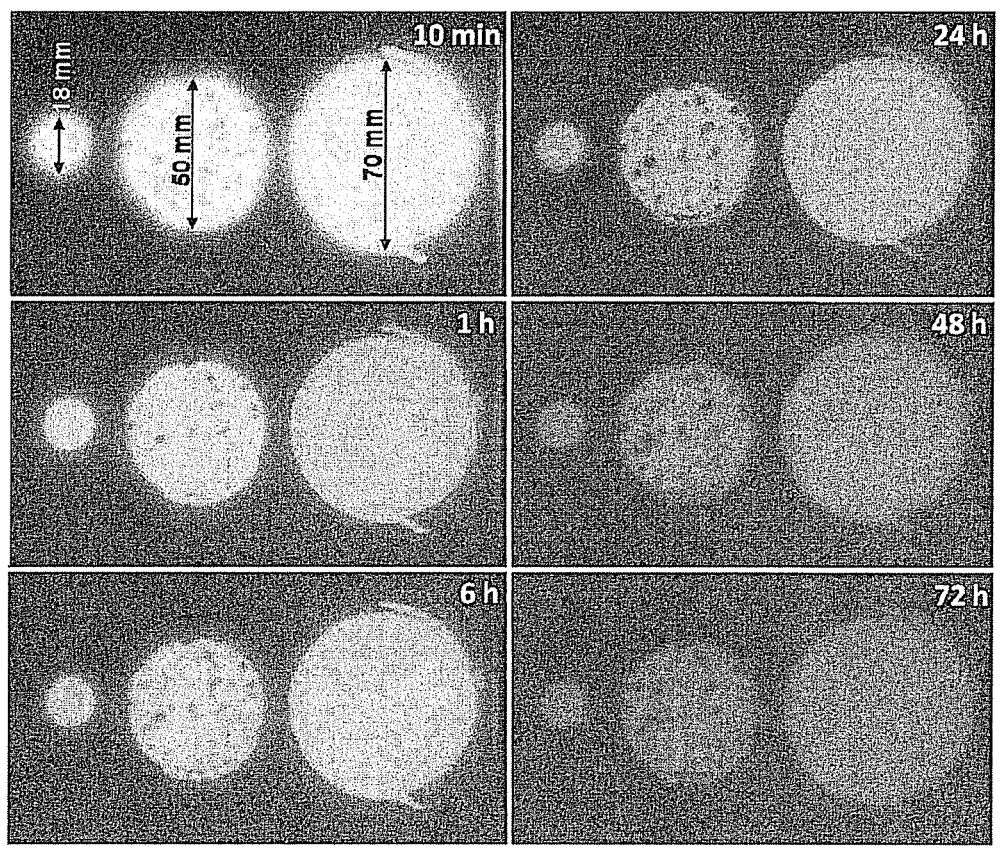
FIG. 7 shows the near infrared images of the afterglow of exemplary $Zn_3Ga_2Ge_4O_{14}$:0.001$Cr^{3+}$ phosphor disks with diameters of 18 mm, 50 mm, and 70 mm exposed to solar radiation for 5 minutes on a cloudy day.

FIG. 7 shows the images of afterglow of three (3) $Zn_3Ga_2Ge_4O_{14}$:$0.001Cr^{3+}$ phosphor disks with diameters of 18 mm, 50 mm, and 70 mm exposed to solar radiation for 5 minutes. The weather condition is cloudy. The images were taken by a digital camera via a Generation III night vision monocular in a dark room. The number at the right top corner of each image is the time after which the image was taken. After 72 hours afterglow, the near infrared emission can still be clearly observed by the night vision monocular and captured by the digital camera. These images clearly show that the samples can be effectively excited by solar radiation even without direct sunlight and that the big and small samples have the same phosphorescence brightness and persistence times.

Figure 8:
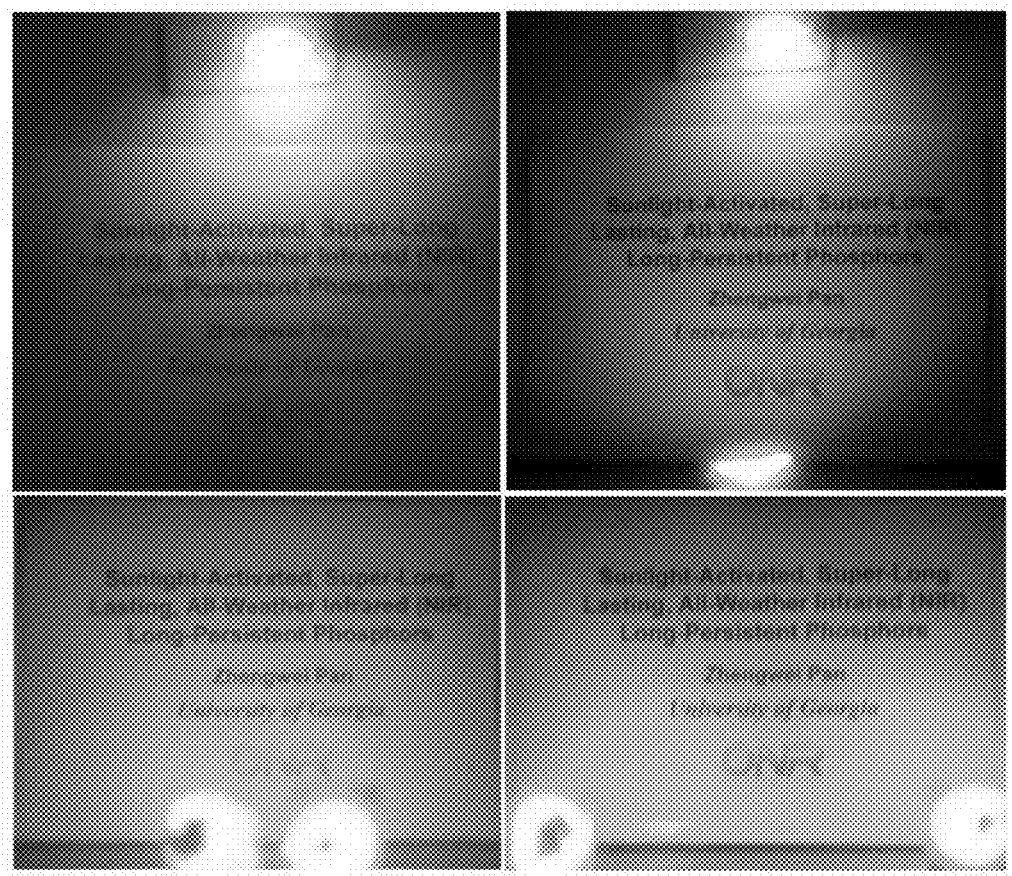
FIG. 8 shows that sunlight activated exemplary $Zn_3Ga_2Ge_4O_{14}$:0.001$Cr^{3+}$ phosphor disks can be used as efficient, secret lighting sources in the dark.

FIG. 8 shows that sunlight activated $Zn_3Ga_2Ge_4O_{14}$:$0.001Cr^{3+}$ phosphor disks (diameter: 19 mm) can be used as efficient, secret lighting sources in the dark. The images were taken by a digital camera via a Generation III night vision monocular in a dark room. The disks were activated by sunlight for 5 minutes. The content on the paper was printed by a laser printer.

Figure 9:
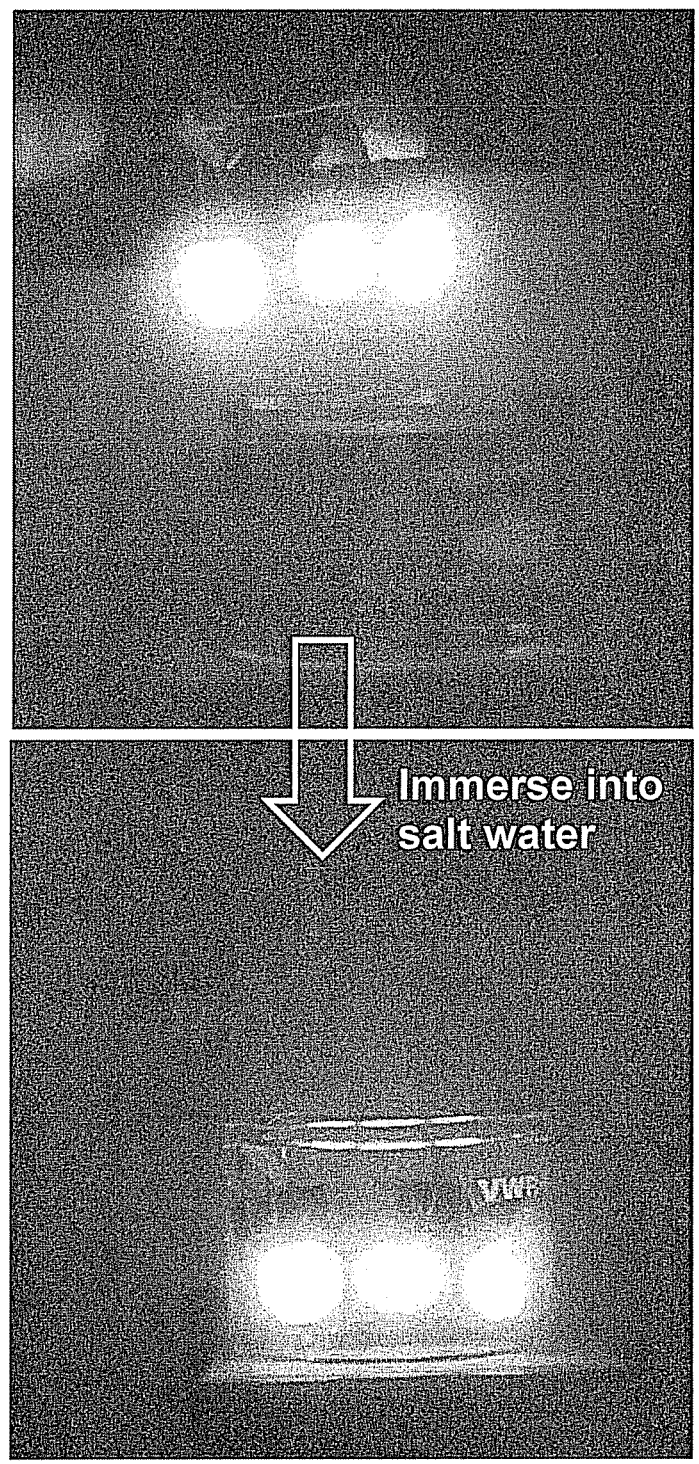
FIG. 9 shows the near infrared images of exemplary $Zn_3Ga_2Ge_4O_{14}$:0.001$Cr^{3+}$ phosphor disks which were exposed to sunlight for 5 minutes and then were immersed into salt (NaCl) water.

FIG. 9 shows the images of three (3) $Zn_3Ga_2Ge_4O_{14}$:$0.001Cr^{3+}$ phosphor disks (diameter: 19 mm) which were exposed to sunlight for 5 minutes and then (5 minutes later) were immersed into salt (NaCl) water. The images were taken by a digital camera via a Generation III night vision monocular in a dark room. The concentration of NaCl in the salt water is 3.5%, which is the same as the salinity of the seawater. The phosphorescence of the disks in the salt water can be clearly seen after 100 hours of emission via a night vision monocular. No apparent corrosion was observed after 6 months of immersion in the salt water. The samples immersed in the salt water for six months exhibit the same excitation, emission, and persistence performance as the fresh ones.

Figure 10:
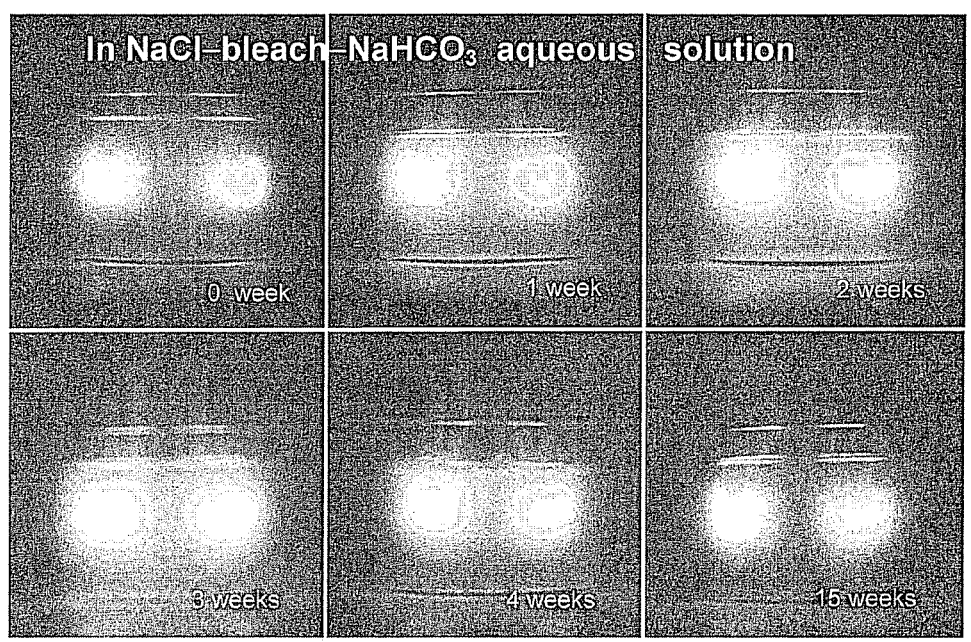
FIG. 10 shows that the exemplary $Zn_3Ga_2Ge_4O_{14}$: 0.001$Cr^{3+}$ phosphor disks can be effectively activated by solar radiation when they were immersed in a NaCl-bleach-bicarbonate ($NaHCO_3$) aqueous solution.

FIG. 10 shows that the $Zn_3Ga_2Ge_4O_{14}$:$0.001Cr^{3+}$ phosphor disks (diameter: 19 mm) can be effectively activated by solar radiation when they were immersed in a NaCl-bleach-bicarbonate ($NaHCO_3$) aqueous solution. The aqueous solution was made by adding 20 drops of bleach, 5 grams of NaCl and 3 grams of $NaHCO_3$ into 75 ml tap water. To keep the solution in a basic pHs and oxidizing conditions, every week 20 drops of bleach and 1 gram of $NaHCO_3$ were added to compensate the evaporation loss. Every week, the samples together with the solution were taken out for recharging by sunlight for 5 minutes and the phosphorescence was imaged by a digital camera via a Generation III night vision monocular in a dark room. The number at the bottom right corner of each image is the days that the samples were immersed in the solution. The images clearly show that the samples immersed in the solution for 15 weeks exhibit the same excitation, emission, and persistence performance as the fresh ones. No apparent corrosion was observed after 100 days of immersion in the NaCl-bleach-$NaHCO_3$ aqueous solution.

Figure 11:
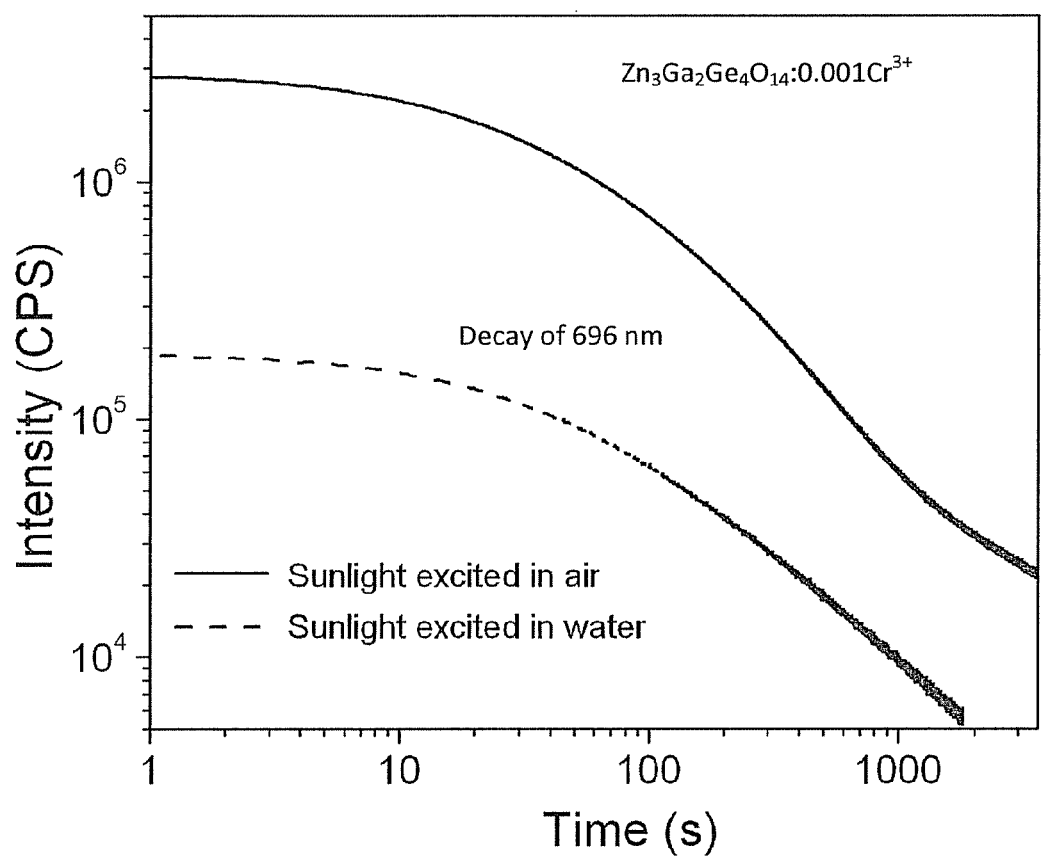
FIG. 11 shows the decay curves of the afterglow (at 696 nm) of exemplary $Zn_3Ga_2Ge_4O_{14}$:0.001$Cr^{3+}$ phosphor disks exposed to direct sunlight for 5 minutes in air and in water.

FIG. 11 shows the decay curves of the afterglow of $Zn_3Ga_2Ge_4O_{14}$:$0.001Cr^{3+}$ phosphor disks exposed to direct sunlight for 5 minutes in air and in water. The decays were monitored at 696 nm. For the case in water, the samples were immersed in water for both excitation and emission measurements. Note that after sunlight excitation, it took 2 minutes to bring the samples to the spectrometer for measurements.

Figure 12:
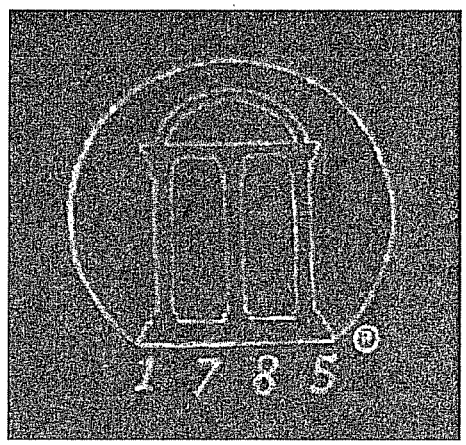
FIG. 12 shows the near infrared images of UGA and ONR logos drawn with exemplary $Zn_3Ga_2Ge_4O_{14}$:0.001$Cr^{3+}$-containing paint. The logos were activated by sunlight for 5 minutes.
Figure 12:
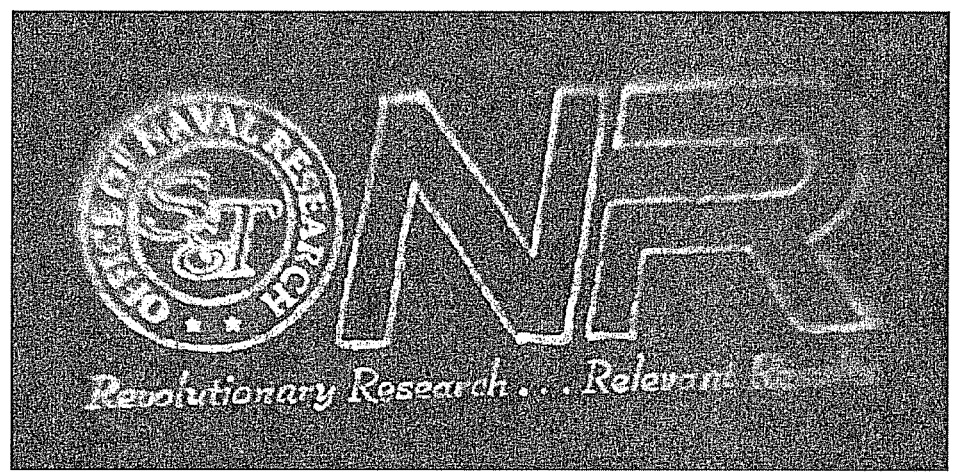

FIG. 12 shows the images of the logos of the University of Georgia (UGA) and the Office of Naval Research (ONR) written with the paint made from the $Zn_3Ga_2Ge_4O_{14}$:$0.001Cr^{3+}$ phosphor powders with acrylic polyurethane varnish. The logos were exposed to sunlight for 5 minutes. The quantity of the phosphor powders in the varnish is 30 wt. %. The images were taken by a digital camera via a Generation III night vision monocular in a dark room. The logos could be clearly seen after 100 hours of emission via a night vision monocular.

Figure 13:
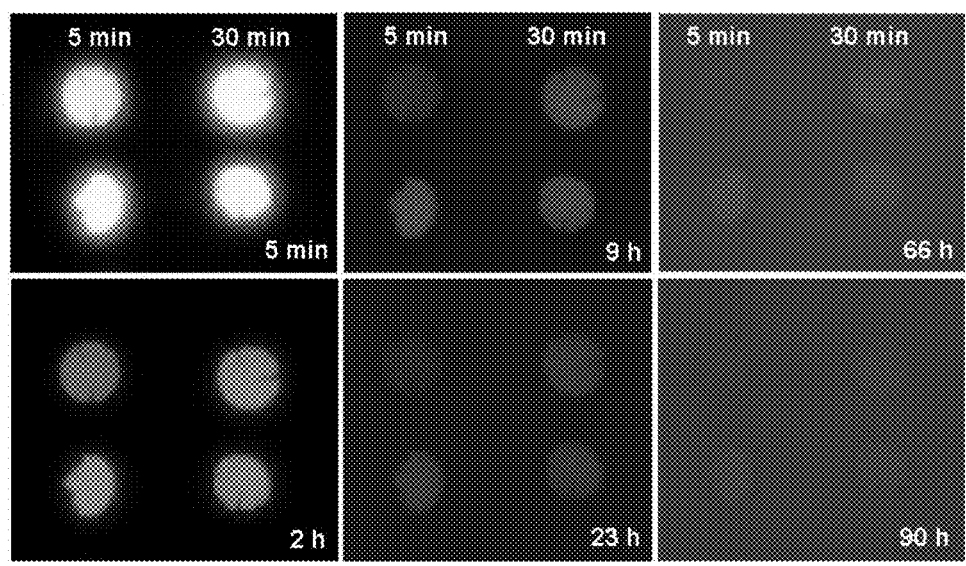
FIG. 13 shows the near infrared images of the afterglow of exemplary $Zn_3Ga_2Ge_4O_{14}$:0.001$Cr^{3+}$ phosphor disks exposed to a fluorescent lamp for 5 minutes and 30 minutes.

FIG. 13 shows the images of the afterglow of four (4) $Zn_3Ga_2Ge_4O_{14}$:$0.001Cr^{3+}$ phosphor disks (diameter: 19 mm) exposed to a fluorescent lamp for 5 minutes and 30 minutes. The images were taken by a digital camera via a Generation III night vision monocular in a dark room. The number at the bottom right corner of each image is the time after which the image was taken. After 90 hours afterglow, the near infrared emission could still be clearly observed by the night vision monocular and captured by the digital camera. These images clearly show that the $Zn_3Ga_2Ge_4O_{14}$:$0.001Cr^{3+}$ phosphor can be effectively activated by a fluorescent lamp and that the samples after 5 minutes and 30 minutes excitation with a fluorescent lamp have similar phosphorescence brightness and persistence times.

Example 3

Preparation and Characterization of $Zn_3Ga_2Ge_4O_{14}$: $Cr^{3+},R^{2+}$ Phosphors $Zn_3Ga_2Ge_4O_{14}$:$0.001Cr^{3+}$,$0.001R^{2+}$ phosphor was prepared by the general method of Example 1 mixing the components in the following molar proportions:

$$3.0ZnO+1.0Ga_2O_3+4.0GeO_2+0.001Cr_2O_3+0.002RO$$

where RO is a oxide selected from MgO, CaO, BaO, and SrO.

Figure 14:
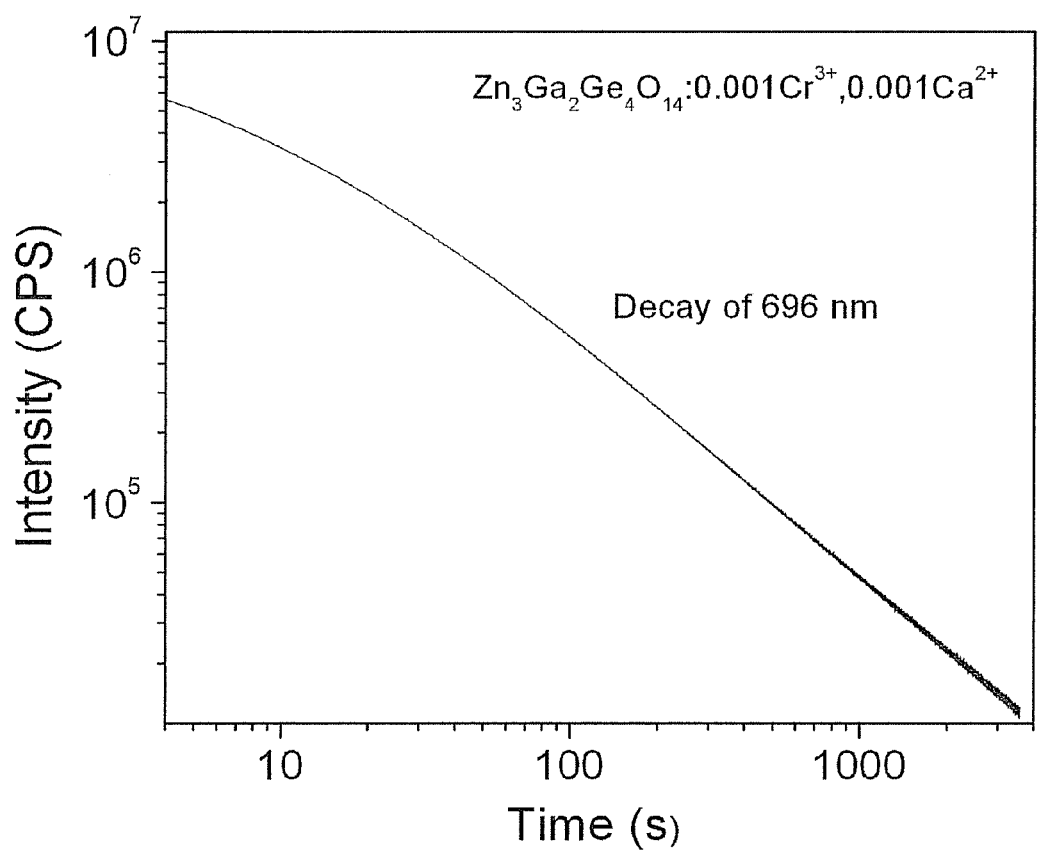
FIG. 14 shows the decay curve of the afterglow (at 696 nm) of exemplary $Zn_3Ga_2Ge_4O_{14}$:0.001$Cr^{3+}$,0.001$Ca^{2+}$ exposed to a 4 W 365 nm ultraviolet lamp for 5 minutes.

FIG. 14 shows the decay curve of the afterglow of $Zn_3Ga_2Ge_4O_{14}$:$0.001Cr^{3+}$,$0.001Ca^{2+}$ sample exposed to a 4 W 365 nm ultraviolet lamp for 5 minutes. The decay was monitored at 696 nm.

Example 4

Preparation and Characterization of $Zn_3Ga_2Ge_4O_{14}$: $Cr^{3+},R^{3+}$ Phosphors $Zn_3Ga_2Ge_4O_{14}$:$0.001Cr^{3+}$,$0.001R^{3+}$ phosphor was prepared by the general method of Example 1 mixing the components in the following molar proportions:

$$3.0ZnO+1.0Ga_2O_3+4.0GeO_2+0.001Cr_2O_3+0.001R_2O_3$$

where RO is a oxide selected from $La_2O_3$, $Ce_2O_3$, $Pr_2O_3$, $Nd_2O_3$, $Eu_2O_3$, $Gd_2O_3$, $Tb_2O_3$, $Dy_2O_3$, $Ho_2O_3$, $Er_2O_3$, $Tm_2O_3$, $Yb_2O_3$, $Lu_2O_3$, and $Bi_2O_3$.

Figure 15:
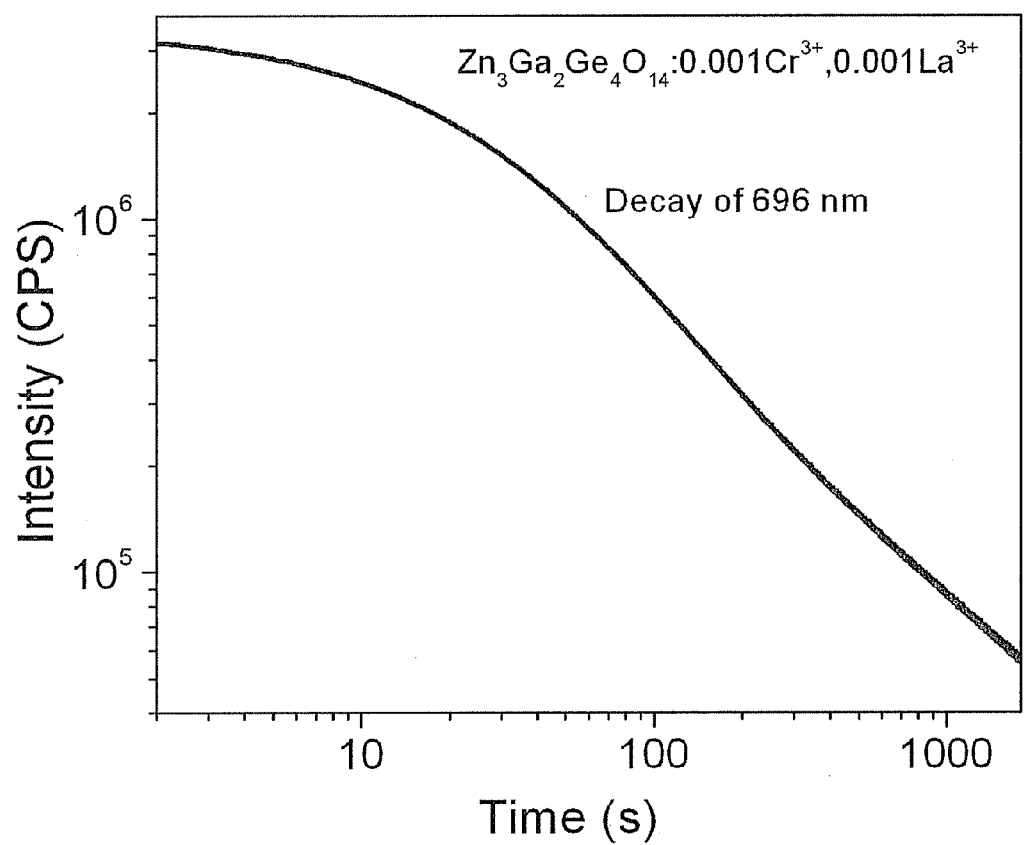
FIG. 15 shows the decay curve of the afterglow of exemplary $Zn_3Ga_2Ge_4O_{14}$:0.001$Cr^{3+}$,0.001$La^{3+}$ exposed to sunlight for 5 minutes. The decay was monitored at 696 nm.

FIG. 15 shows the decay curve of the afterglow of $Zn_3Ga_2Ge_4O_{14}$:$0.001Cr^{3+}$,$0.001La^{3+}$ sample exposed to sunlight for 5 minutes. The decay was monitored at 696 nm.

Example 5

Preparation and Characterization of $Zn_3Ga_2Ge_4O_{14}$: $Cr^{3+},Li^+$ Phosphors $Zn_3Ga_2Ge_4O_{14}$:$0.001Cr^{3+}$,$0.001Li^+$ phosphor was prepared by the general method of Example 1 mixing the components in the following molar proportions:

$$3.0ZnO+1.0Ga_2O_3+4.0GeO_2+0.001Cr_2O_3+0.001Li_2O$$

Figure 16:
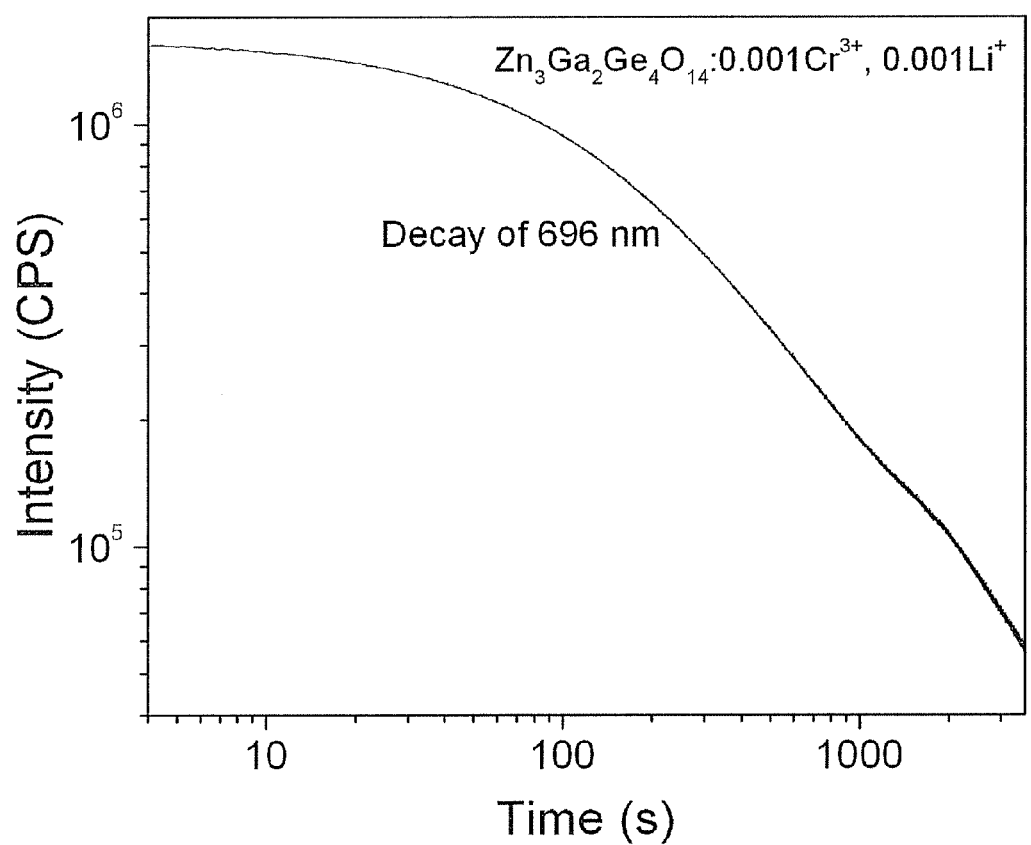
FIG. 16 shows the decay curve of the afterglow (at 696 nm) of exemplary $Zn_3Ga_2Ge_4O_{14}$:0.001$Cr^{3+}$,0.001$Li^+$ exposed to solar radiation for 5 minutes in a rainy day.

FIG. 16 shows the decay curve of the afterglow of $Zn_3Ga_2Ge_4O_{14}$:$0.001Cr^{3+}$,$0.001Li^+$ sample exposed to solar radiation for 5 minutes in a rainy day. The decay was monitored at 696 nm.

Example 6

Preparation and Characterization of $Zn_3Ga_2Ge_4O_{14}$: $Ni^{2+}$ Phosphors $Zn_3Ga_2Ge_4O_{14}$:$0.002Ni^{2+}$ phosphor was prepared by the general method of Example 1 mixing the components in the following molar proportions:

$$3.0ZnO+1.0Ga_2O_3+4.0GeO_2+0.004NiO$$

Figure 17:
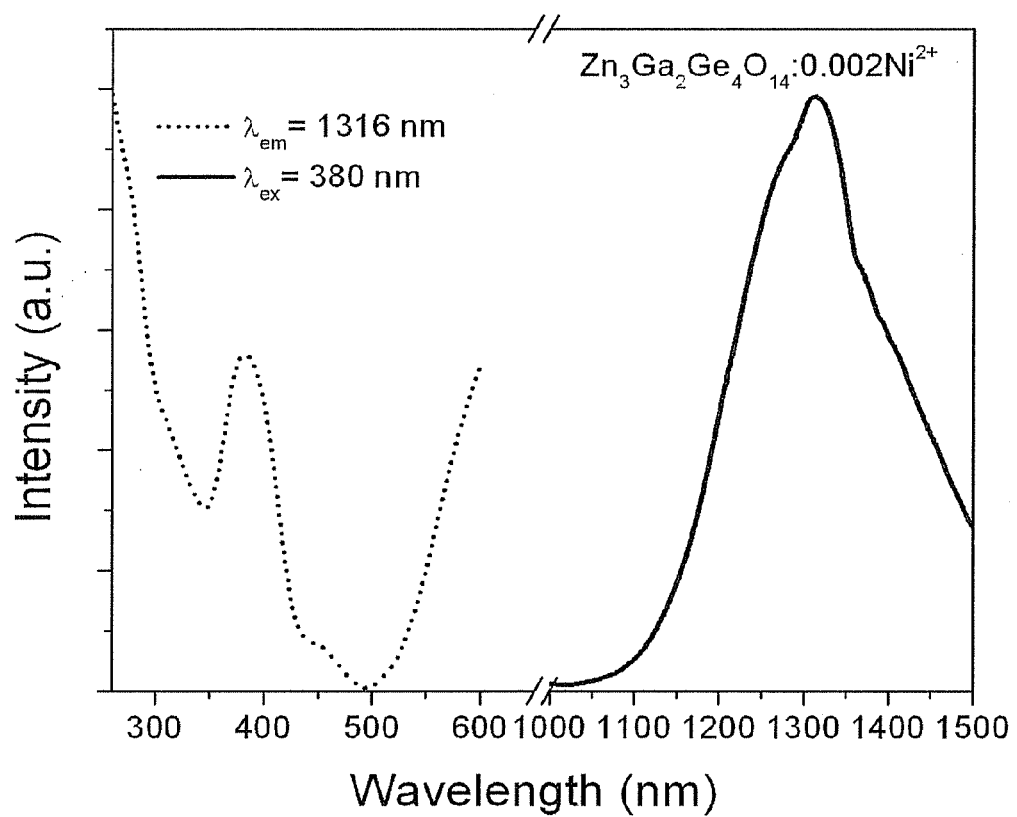
FIG. 17 shows the excitation and emission of exemplary $Zn_3Ga_2Ge_4O_{14}$:0.002$Ni^{2+}$ phosphors detected by a GaInAs infrared detector where the excitation spectrum was monitored at 1316 nm.

FIG. 17 presents the excitation and emission of $Zn_3Ga_2Ge_4O_{14}$:$0.002Ni^{2+}$ phosphors detected by a GaInAs infrared detector where the excitation spectrum was monitored at 1316 nm.

Figure 18:
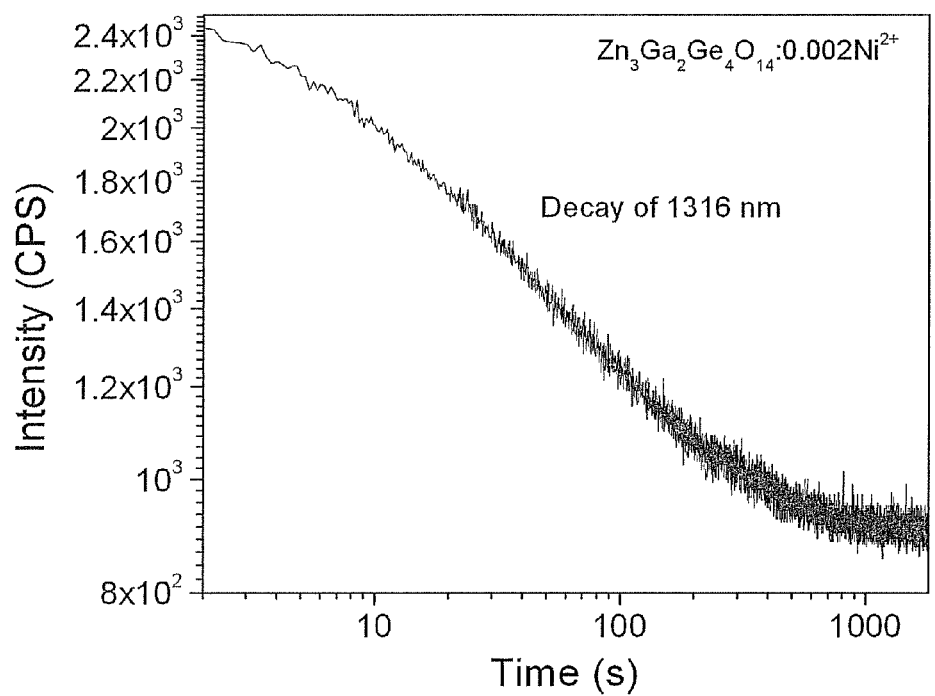
FIG. 18 shows the decay curve of the afterglow (at 1316 nm) of exemplary $Zn_3Ga_2Ge_4O_{14}$:0.002 $Ni^{2+}$ exposed to a 4 W 365 nm ultraviolet lamp for 5 minutes.

FIG. 18 shows the decay curve of the afterglow of $Zn_3Ga_2Ge_4O_{14}$:$0.002Ni^{2+}$ samples exposed to a 4 W 365 nm wavelength ultraviolet lamp for 5 minutes. The decays were monitored at 1316 nm.

Figure 19:
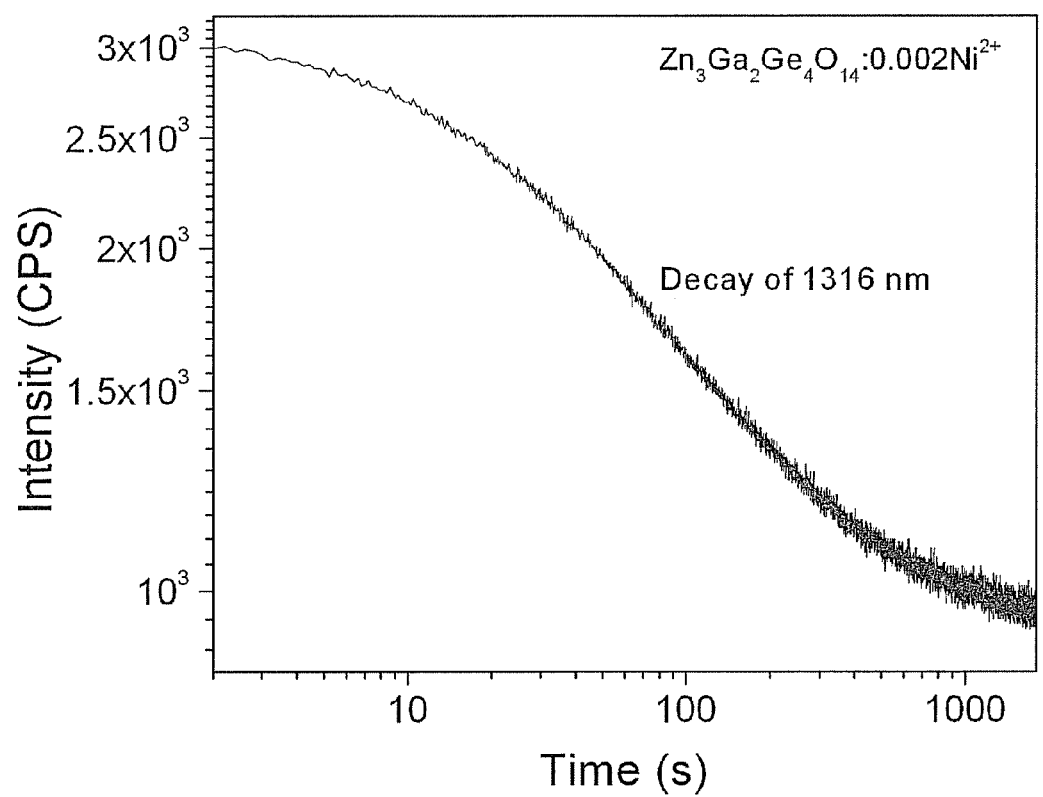
FIG. 19 shows the decay curve of the afterglow (at 1316 nm) of exemplary $Zn_3Ga_2Ge_4O_{14}$:0.002$Ni^{2+}$ exposed to sunlight for 5 minutes.

FIG. 19 shows the decay curve of the afterglow of $Zn_3Ga_2Ge_4O_{14}$:$0.002Ni^{2+}$ samples exposed to sunlight for 5 minutes. The decays were monitored at 1316 nm.

Example 7

Preparation and Characterization of $Zn_3(GaIn)Ge_4O_{14}$:$Cr^{3+}$ Phosphors $Zn_3(GaIn)Ge_4O_{14}$:$0.001Cr^{3+}$ phosphor was prepared by the general method of Example 1 mixing the components in the following molar proportions:

$$3.0ZnO+0.5Ga_2O_3+0.5In_2O_3+4.0GeO_2+0.001Cr_2O_3$$

Figure 20:
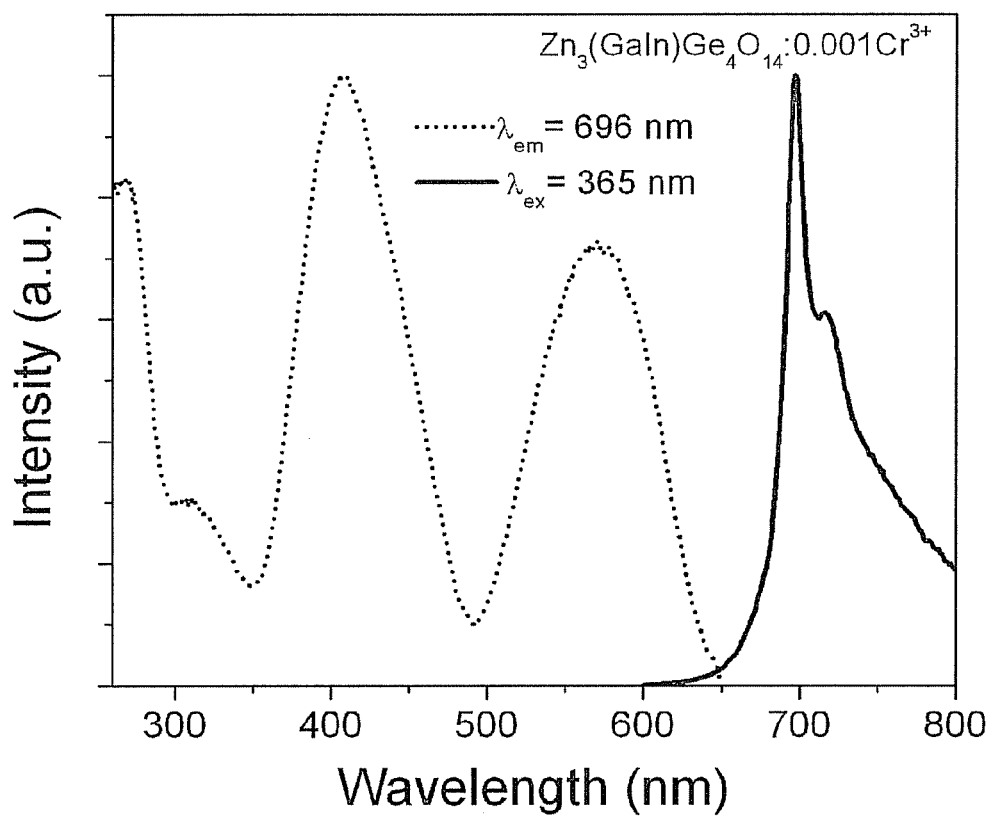
FIG. 20 shows the excitation and emission of exemplary $Zn_3(GaIn)Ge_4O_{14}$:0.001$Cr^{3+}$ phosphors where the excitation spectrum was monitored at 696 nm.

FIG. 20 presents the excitation and emission of $Zn_3(GaIn)Ge_4O_{14}$:$0.001Cr^3$ phosphors where the excitation spectrum was monitored at 696 nm.

Figure 21:
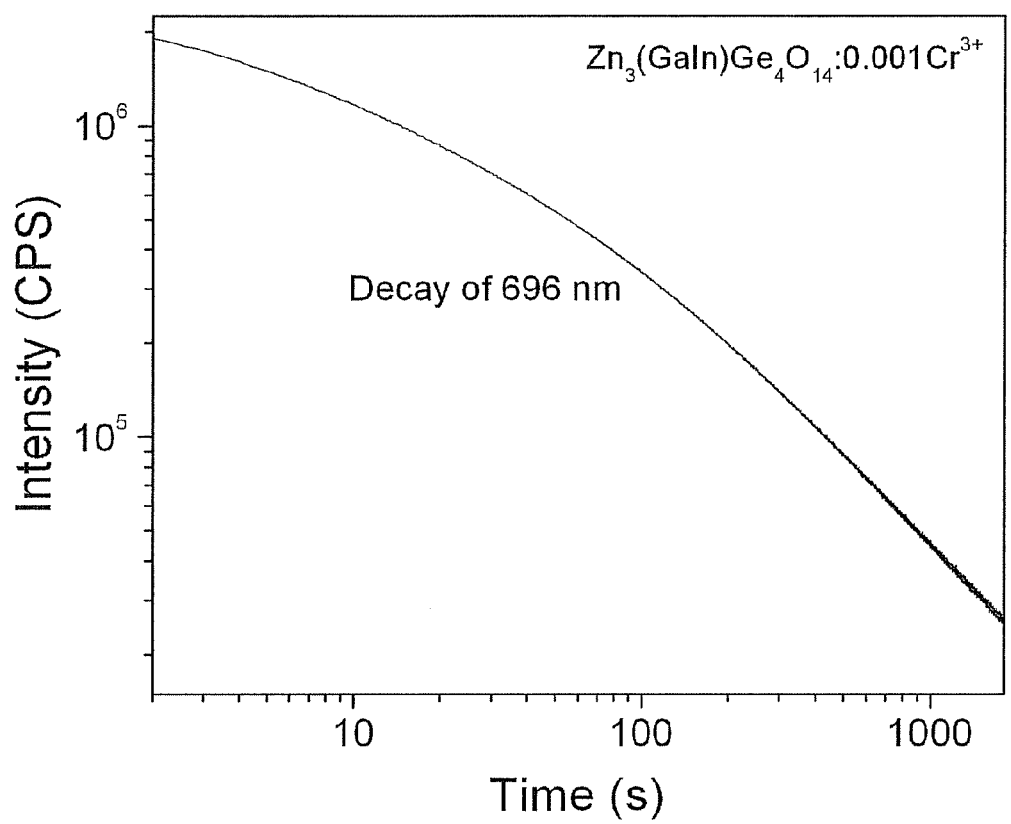
FIG. 21 shows the decay curve of the afterglow (at 696 nm) of exemplary $Zn_3(GaIn)Ge_4O_{14}$:0.001$Cr^{3+}$ sample exposed to a 4 W 365 nm ultraviolet lamp for 5 minutes.

FIG. 21 shows the decay curve of the afterglow of $Zn_3(GaIn)Ge_4O_{14}$:$0.001Cr^{3+}$ sample exposed to a 4 W 365 nm wavelength ultraviolet lamp for 5 minutes. The decays were monitored at 696 nm.

Figure 22:
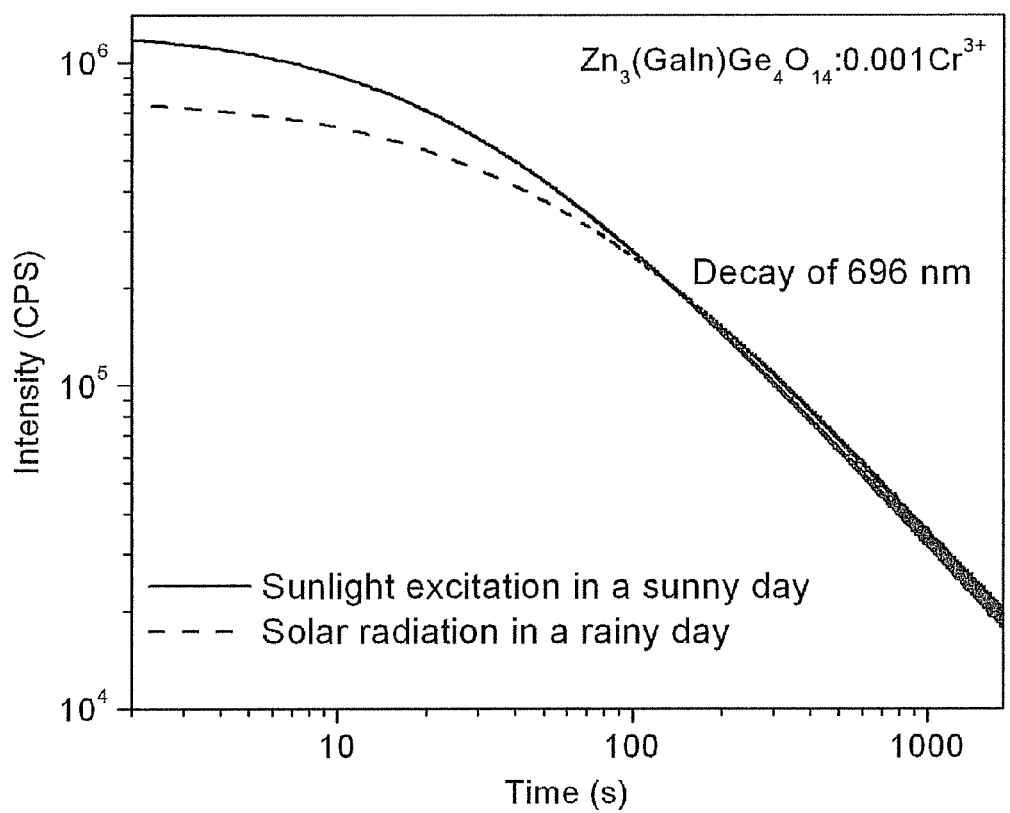
FIG. 22 shows the decay curves of the afterglow (at 696 nm) of exemplary $Zn_3(GaIn)Ge_4O_{14}$:0.001$Cr^{3+}$ exposed to sunlight in a sunny day for 5 minutes and to solar radiation in a rainy day for 5 minutes.

FIG. 22 shows the decay curves of the afterglow of $Zn_3(GaIn)Ge_4O_{14}$:$0.001Cr^{3+}$ samples exposed to sunlight in a sunny day for 5 minutes and to solar radiation in a rainy day for 5 minutes. The decays were monitored at 696 nm.

Example 8

Preparation and Characterization of $Zn_3Ga_2(Ge_3Sn)O_{14}$:$Cr^{3+}$ Phosphors $Zn_3Ga_2(Ge_3Sn)O_{14}$:$0.001Cr^{3+}$ phosphor was prepared by the general method of Example 1 mixing the components in the following molar proportions:

$$3.0ZnO+1.0Ga_2O_3+3.0GeO_2+1.0SnO_2+0.001Cr_2O_3$$

Figure 23:
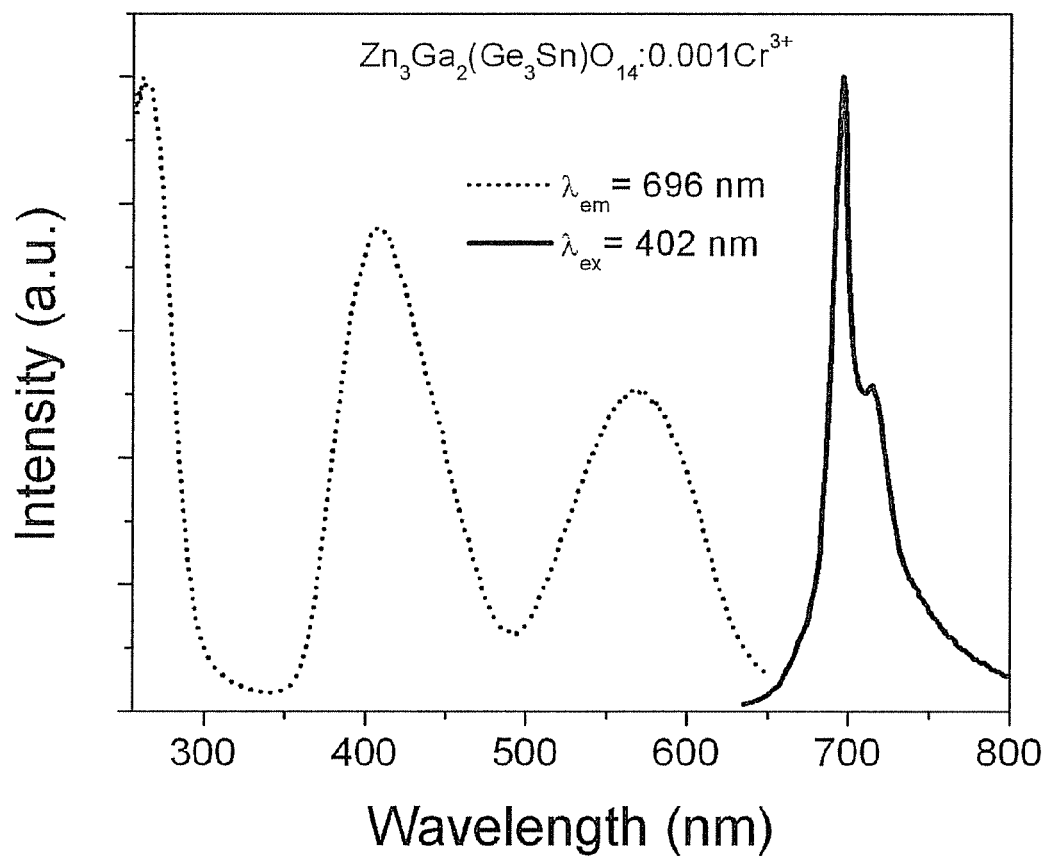
FIG. 23 shows the excitation and emission of exemplary $Zn_3Ga_2(Ge_3Sn)O_{14}$:0.001$Cr^{3+}$ phosphors where the excitation spectrum was monitored at 696 nm.

FIG. 23 presents the excitation and emission of $Zn_3Ga_2(Ge_3Sn)O_{14}$:$0.001Cr^{3+}$ phosphors where the excitation spectrum was monitored at 696 nm.

Figure 24:
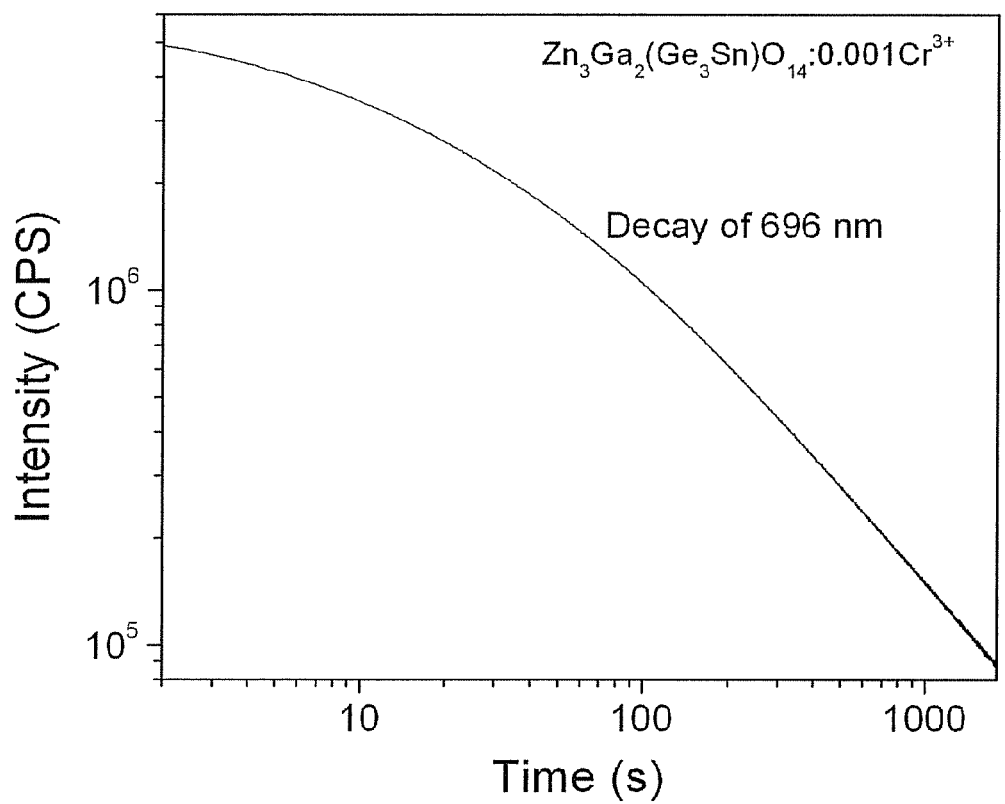
FIG. 24 shows the decay curve of the afterglow (at 696 nm) of exemplary $Zn_3Ga_2(Ge_3Sn)O_{14}$:0.001$Cr^{3+}$ sample exposed to a 4 W 365 nm wavelength ultraviolet lamp for 5 minutes.

FIG. 24 shows the decay curve of the afterglow of $Zn_3Ga_2(Ge_3Sn)O_{14}$:$0.001Cr^{3+}$ sample exposed to a 4 W 365 nm wavelength ultraviolet lamp for 5 minutes. The decays were monitored at 696 nm.

Figure 25:
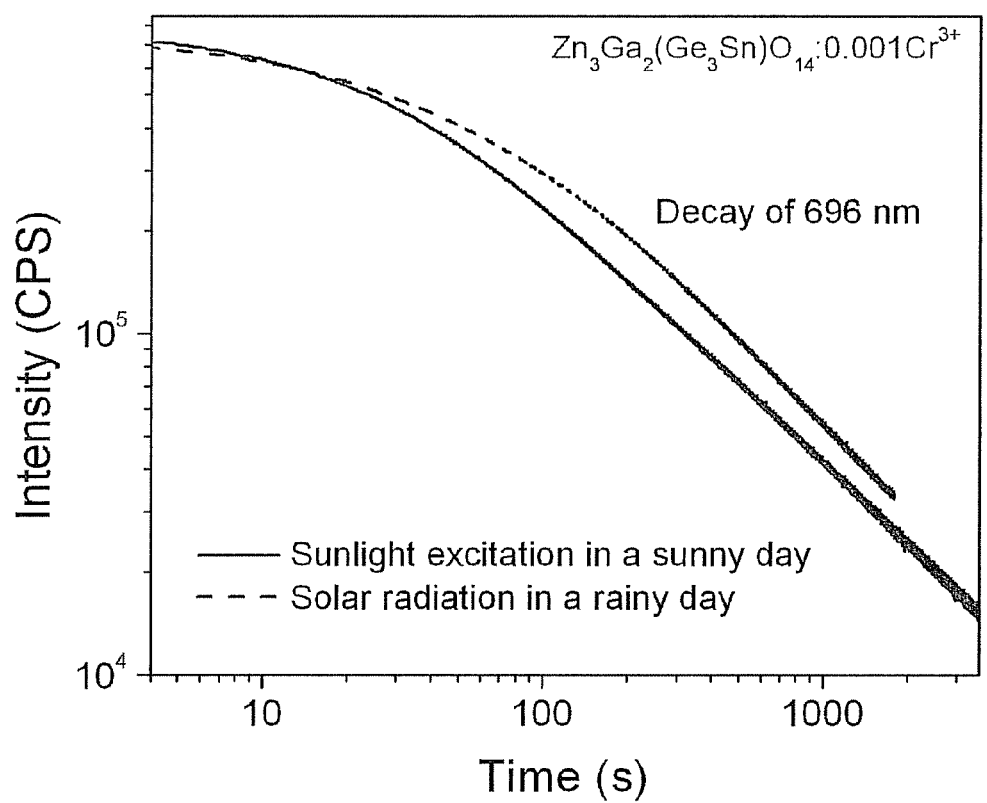
FIG. 25 shows the decay curves of the afterglow (696 nm) of exemplary $Zn_3Ga_2(Ge_3Sn)O_{14}$:0.001$Cr^{3+}$ samples exposed to sunlight in a sunny day for 5 minutes and to solar radiation in a rainy day for 5 minutes.

FIG. 25 shows the decay curves of the afterglow of $Zn_3Ga_2(Ge_3Sn)O_{14}$:$0.001Cr^{3+}$ samples exposed to sunlight in a sunny day for 5 minutes and to solar radiation in a rainy day for 5 minutes. The decays were monitored at 696 nm.

Figure 26:
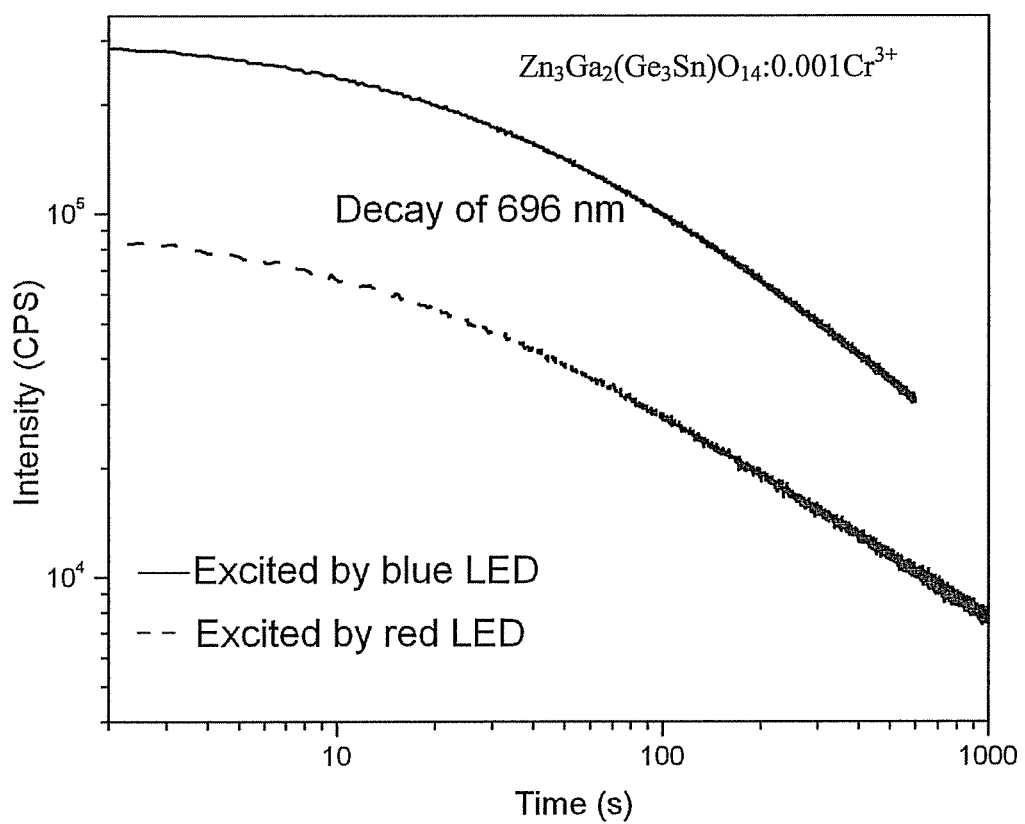
FIG. 26 shows the decay curves of the afterglow (at 696 nm) of exemplary $Zn_3Ga_2(Ge_3Sn)O_{14}$:0.001$Cr^{3+}$ samples exposed to blue and red LEDs for 5 minutes.

FIG. 26 shows the decay curves of the afterglow of $Zn_3Ga_2(Ge_3Sn)O_{14}$:$0.001Cr^{3+}$ samples exposed to blue and red LEDs for 5 minutes. The decays were monitored at 696 nm

Example 9

Preparation and Characterization of $Zn_3Ga_2Ge_3O_{12}$:$Cr^{3+}$ Phosphors $Zn_3Ga_2Ge_3O_{12}$:$0.001Cr^{3+}$ phosphor was prepared by the general method of Example 1 mixing the components in the following molar proportions:

$$3.0ZnO+1.0Ga_2O_3+3.0GeO_2+0.001Cr_2O_3$$

Figure 27:
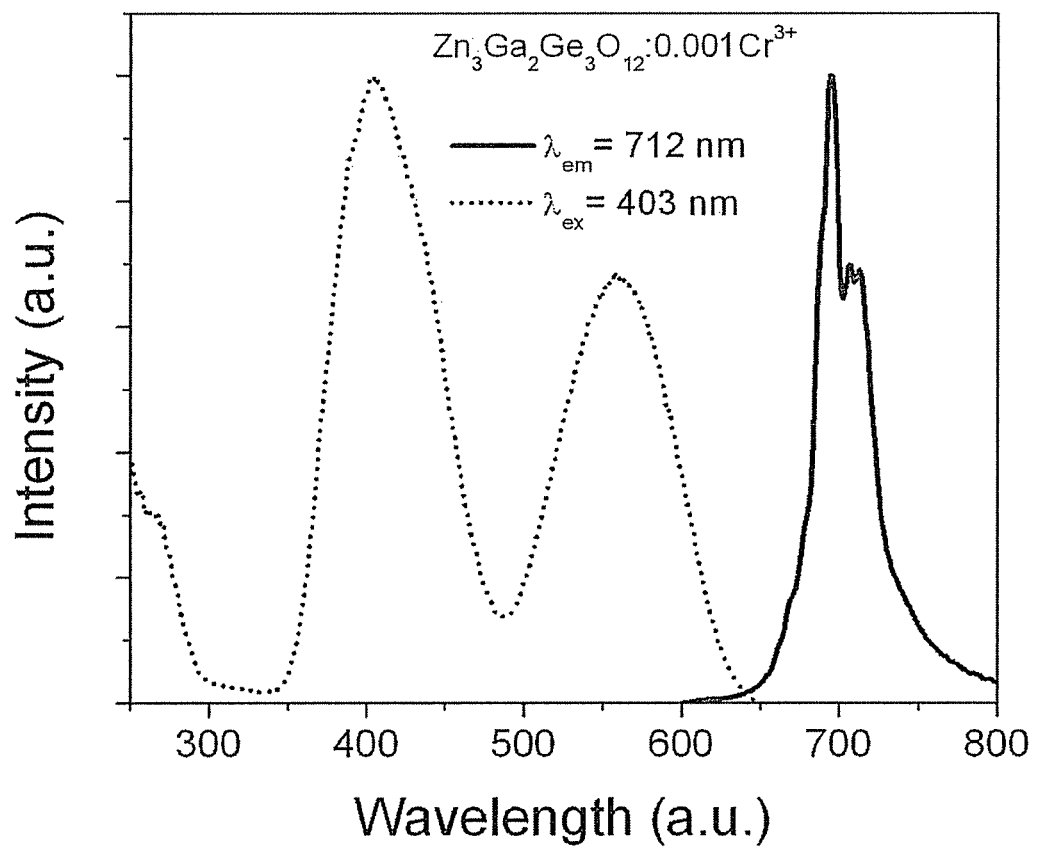
FIG. 27 shows the excitation and emission of exemplary $Zn_3Ga_2Ge_3O_{12}$:0.001$Cr^{3+}$ phosphors where the excitation spectrum was monitored at 696 nm.

FIG. 27 presents the excitation and emission of $Zn_3Ga_2Ge_3O_{12}$:$0.001Cr^{3+}$ phosphors where the excitation spectrum was monitored at 696 nm.

Figure 28:
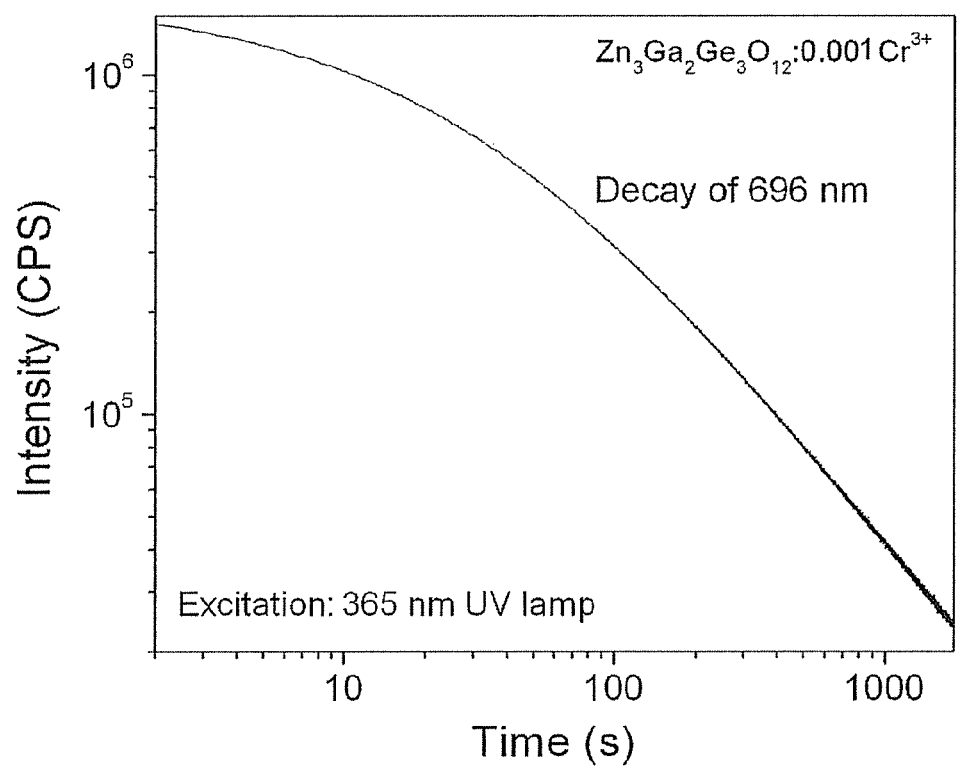
FIG. 28 shows the decay curve of the afterglow (at 696 nm) of exemplary $Zn_3Ga_2Ge_3O_{12}$:0.001$Cr^{3+}$ exposed to a 4 W 365 nm wavelength ultraviolet lamp for 5 minutes.

FIG. 28 shows the decay curve of the afterglow of $Zn_3Ga_2Ge_3O_{12}$:$0.001Cr^{3+}$ sample exposed to a 4 W 365 nm wavelength ultraviolet lamp for 5 minutes. The decays were monitored at 696 nm.

Figure 29:
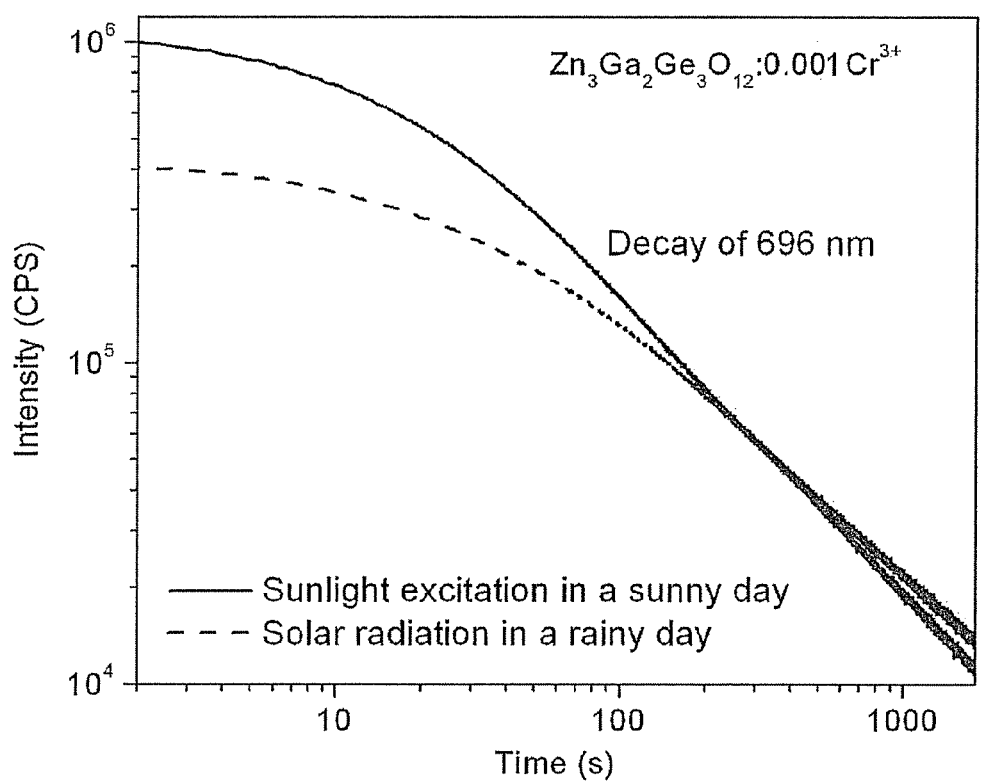
FIG. 29 shows the decay curves of the afterglow (at 696 nm) of exemplary $Zn_3Ga_2Ge_3O_{12}$:0.001$Cr^{3+}$ exposed to sunlight in, a sunny day for 5 minutes and to solar radiation in a rainy day for 5 minutes.

FIG. 29 shows the decay curves of the afterglow of $Zn_3Ga_2Ge_3O_{12}$:0.001$Cr^{3+}$ samples exposed to sunlight in a sunny day for 5 minutes and to solar radiation in a rainy day for 5 minutes. The decays were monitored at 696 nm.

Example 10

Preparation and Characterization of $Zn_3Ga_2Ge_5O_{16}$: $Cr^{3+}$ Phosphors $Zn_3Ga_2Ge_5O_{16}$:0.001$Cr^{3+}$ phosphor was prepared by the general method of Example 1 mixing the components in the following molar proportions:

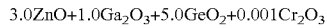
3.0ZnO+1.0Ga$_2$O$_3$+5.0GeO$_2$+0.001Cr$_2$O$_3$

Figure 30:
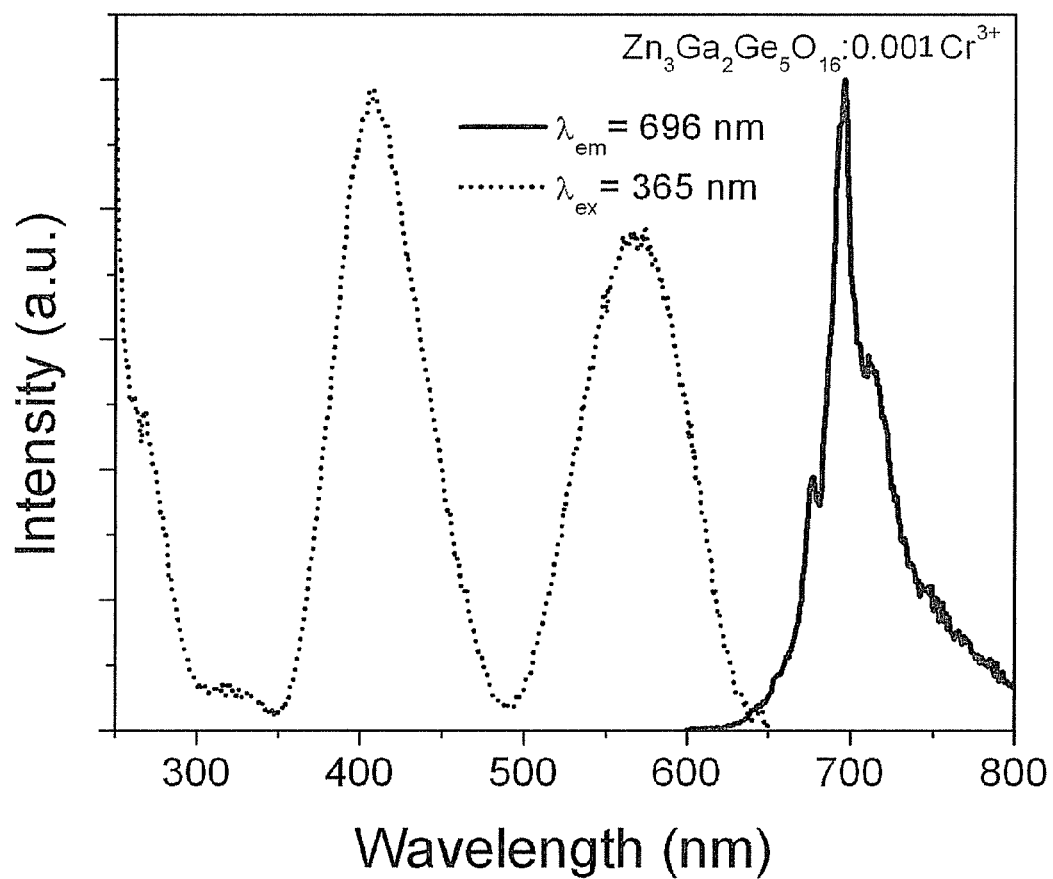
FIG. 30 shows the excitation and emission of exemplary $Zn_3Ga_2Ge_5O_{16}$:0.001$Cr^{3+}$ phosphors where the excitation spectrum was monitored at 696 nm.

FIG. 30 presents the excitation and emission of $Zn_3Ga_2Ge_5O_{16}$:0.001$Cr^{3+}$ phosphors where the excitation spectrum was monitored at 696 nm.

Figure 31:
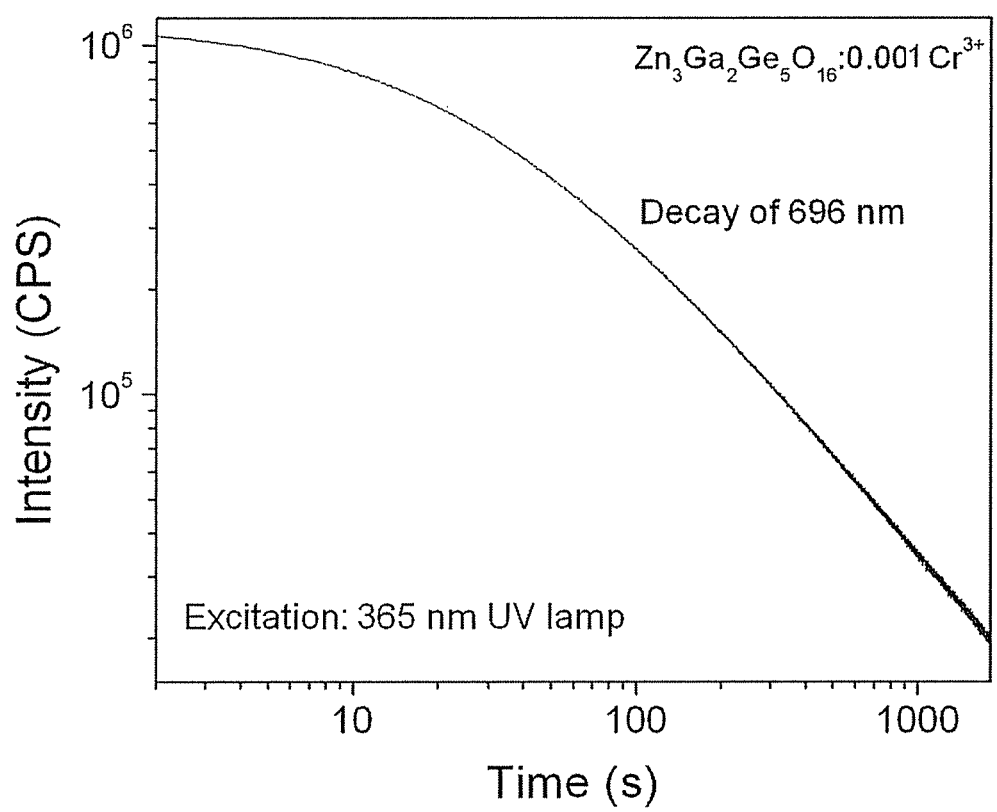
FIG. 31 shows the decay curve of the afterglow (at 696 nm) of exemplary $Zn_3Ga_2Ge_5O_{16}$:0.001$Cr^{3+}$ exposed to a 4 W 365 nm wavelength ultraviolet lamp for 5 minutes.

FIG. 31 shows the decay curve of the afterglow of $Zn_3Ga_2Ge_5O_{16}$:0.001$C^{3+}$ sample exposed to a 4 W 365 nm wavelength ultraviolet lamp for 5 minutes. The decays were monitored at 696 nm.

Figure 32:
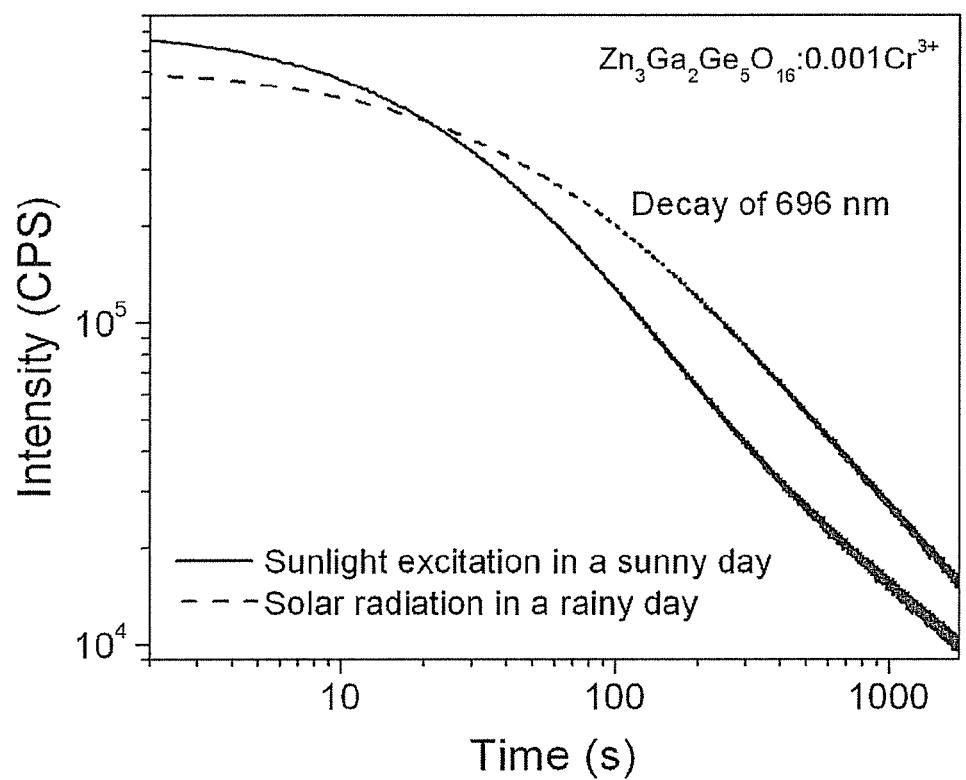
FIG. 32 shows the decay curves of the afterglow (at 696 nm) of exemplary $Zn_3Ga_2Ge_5O_{16}$:0.001$Cr^{3+}$ exposed to sunlight in a sunny day for 5 minutes and to solar radiation in a rainy day for 5 minutes.

FIG. 32 shows the decay curves of the afterglow of $Zn_3Ga_2Ge_5O_{16}$:0.001$Cr^{3+}$ samples exposed to sunlight in a sunny day for 5 minutes and to solar radiation in a rainy day for 5 minutes. The decays were monitored at 696 nm.

The complete disclosures of the patents, patent documents, and publications cited herein are incorporated by reference in their entirety as if each were individually incorporated. Various modifications and alterations to this invention will become apparent to those skilled in the art without departing from the scope and spirit of this invention. It should be understood that this invention is not intended to be unduly limited by the illustrative embodiments and examples set forth herein and that such examples and embodiments are presented by way of example only with the scope of the invention intended to be limited only by the claims set forth herein as follows.

What is claimed is:

1. A phosphor comprising a material of the formula:

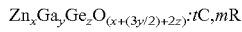
Zn$_x$Ga$_y$Ge$_z$O$_{(x+(3y/2)+2z)}$·$t$C,$m$R wherein a portion of Ga may optionally be replaced with a Group IIIA metal;
wherein a portion or all of Ge may optionally be replaced with a Group IVA metal; and
wherein C is $Cr^{3+}$, $Ni^{2+}$, or a combination thereof;
R is an ion selected from a group consisting of alkaline earth ions, lanthanide ions, $Li^+$ ions, and combinations thereof;
x is 3;
y is 2;
z is 1 to 5;
t is 0.01 to 5 and represents mol % based on the total moles of Ga and any replacements thereof; and
m is 0 to 5 and represents mol % based on the total moles of Ga and any replacements thereof,
wherein the phosphor has at least one emission band in the near infrared.

2. The phosphor of claim 1 wherein t is 0.05 to 2 and represents mol % based on the total moles of Ga and any replacements thereof.

3. The phosphor of claim 1 wherein m is 0 to 2 and represents mol % based on the total moles of Ga and any replacements thereof.

4. The phosphor of claim 1 wherein the alkaline earth ion is selected from the group consisting of $Mg^{2+}$, $Ca^{2+}$, $Sr^{2+}$, $Ba^{2+}$, and combinations thereof.

5. The phosphor of claim 1 wherein the lanthanide ion is selected from the group consisting of $La^{3+}$, $Ce^{3+}$, $Pr^{3+}$, $Nd^{3+}$, $Eu^{3+}$, $Gd^{3+}$, $Tb^{3+}$, $Dy^{3+}$, $Ho^{3+}$, $Er^{3+}$, $Tm^{3+}$ $Yb^{3+}$, $Lu^{3+}$, and combinations thereof.

6. The phosphor of claim 1 wherein C is $Cr^{3+}$.

7. The phosphor of claim 6 having emission band peaks at 690 to 1100 nm.

8. The phosphor of claim 1 wherein C is $Ni^{2+}$.

9. The phosphor of claim 8 having emission band peaks at 1100 to 1550 nm.

10. The phosphor of claim 1 wherein C is a combination of $Cr^{3+}$ and $Ni^{2+}$.

11. The phosphor of claim 10 having emission band peaks at 690 to 1100 nm and 1100 to 1550 nm.

12. The phosphor of claim 1 wherein a portion of Ga is replaced with a Group IIIA metal.

13. The phosphor of claim 12 wherein the Group IIIA metal is Al or In.

14. The phosphor of claim 1 wherein a portion or all of Ge is replaced with a Group IVA metal.

15. The phosphor of claim 14 wherein the Group IVA metal is Si or Sn.

16. The phosphor of claim 1 wherein an emission persists for up to 400 hours after excitation.

17. The phosphor of claim 1 wherein the phosphor is chemically stable in one or more of air, tap water, salt water, seawater, bleach water, and bleach-salt-sodium bicarbonate ($NaHCO_3$) aqueous solution.

18. A luminescent paint comprising a phosphor according to claim 1.

19. A method of activating a phosphor comprising:
providing a phosphor according to claim 1; and
exposing the phosphor to one or more of solar radiation, an ultraviolet lamp, a fluorescent lamp, and a light emitting diode (LED) light.

20. An activated phosphor comprising a phosphor according to claim 1 that has been exposed to one or more of solar radiation, an ultraviolet lamp, a fluorescent lamp, and a light emitting diode (LED) light, and wherein the activated phosphor has an emission that persists for up to 400 hours after excitation.

* * * * *